(12) United States Patent
Koo et al.

(10) Patent No.: US 8,637,910 B2
(45) Date of Patent: Jan. 28, 2014

(54) IMAGE SENSOR

(75) Inventors: Junemo Koo, Suwon-si (KR); Ihara Hisanori, Seongnam-si (KR); Yoondong Park, Yongin-si (KR); HoonSang Oh, Seongnam-si (KR); Sangjun Choi, Yongin-si (KR); HyungJin Bae, Suwon-si (KR); Tae Eung Yoon, Seoul (KR); Sungkwon Hong, Los Angeles, CA (US)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 558 days.

(21) Appl. No.: 12/940,499

(22) Filed: Nov. 5, 2010

(65) Prior Publication Data

US 2011/0108897 A1    May 12, 2011

(30) Foreign Application Priority Data

Nov. 6, 2009  (KR) .................. 10-2009-0107122
Aug. 27, 2010  (KR) .................. 10-2010-0083681

(51) Int. Cl.
*H01L 31/113*    (2006.01)

(52) U.S. Cl.
USPC ............. 257/292; 257/E31.085; 257/219; 257/225; 257/240; 257/246

(58) Field of Classification Search
USPC ........... 257/292, E31.085, 219, 225, 240, 246
See application file for complete search history.

(56) References Cited

U.S. PATENT DOCUMENTS

| 7,572,701 | B2 | 8/2009 | Adkisson et al. | |
|---|---|---|---|---|
| 2006/0138486 | A1 | 6/2006 | Lim | |
| 2006/0145215 | A1* | 7/2006 | Paik et al. | 257/293 |
| 2008/0185619 | A1 | 8/2008 | Merrill | |
| 2008/0277693 | A1* | 11/2008 | Mauritzson et al. | 257/205 |
| 2009/0256226 | A1* | 10/2009 | Tatani et al. | 257/432 |

FOREIGN PATENT DOCUMENTS

| JP | 2007-294531 A | 11/2007 |
|---|---|---|
| KR | 10-2006-0072749 A | 6/2006 |
| KR | 10-2007-0071074 A | 7/2007 |

* cited by examiner

*Primary Examiner* — Marc Armand
(74) *Attorney, Agent, or Firm* — Lee & Morse, P.C.

(57) ABSTRACT

An image sensor includes an active region including a photoelectric conversion region and a floating diffusion region, which are separated from each other, defined by a device isolation region on a semiconductor substrate, and a transfer transistor including a first sub-gate provided on an upper surface of the semiconductor substrate and a second sub-gate extending within a recessed portion of the semiconductor substrate on the active region between the photoelectric conversion region and the floating diffusion region, wherein the photoelectric conversion region includes a plurality of photoelectric conversion elements, which vertically overlap each other within the semiconductor substrate and are spaced apart from the recessed portion.

28 Claims, 31 Drawing Sheets

IMAGE SENSOR

BACKGROUND

1. Field

Embodiments relate to semiconductor devices and, more specifically, to image sensors.

2. Description of the Related Art

Typically, an image sensor is a semiconductor device that converts optical image into an electrical signal. Such image sensor may be a CMOS type or a charge coupled device (CCD) type. A CMOS type image sensor is abbreviated as CMOS image sensor (CIS). A CIS includes a plurality of pixels in a two-dimensional arrangement, where each and every pixel includes a respective photodiode. Photodiodes convert incident light into an electrical signal.

SUMMARY

Embodiments are therefore directed to image sensors, which substantially overcome one or more of the problems due to the limitations and disadvantages of the related art.

It is therefore a feature of an embodiment to provide image sensors, which receive more light when light is incident upon a limited area as compared to comparable convention image sensors.

It is therefore a separate feature of an embodiment to provide image sensors including a plurality of photoelectric conversion regions that may be vertically disposed and may receive more incident light incident upon a pixel, thereby generating more charges and improving sensing margins.

It is therefore a separate feature of an embodiment to provide image sensors including a transfer transistor including multiple channels, e.g., 3 channels, i.e., a surface channel, a side channel, and a buried channel.

It is therefore a separate feature of an embodiment to provide image sensors having improved charge transport speed and/or reduced image lag as compared to comparable conventional image sensors.

It is therefore a separate feature of an embodiment to provide an image sensor including a plurality of vertically overlapping photoelectric conversion regions and a transfer gate extending into a semiconductor substrate, thereby generating many signal chargers and improving sensing margins.

It is therefore a separate feature of an embodiment to provide an image sensor including a transfer transistor that includes a surface channel, a side channel and a buried channel, such that a transport speed of signal charges may be enhanced and image lag can may be reduced and/or substantially avoided.

At least one of the above and other features and advantages may be realized by providing an image sensor, including an active region including a photoelectric conversion region and a floating diffusion region, which are separated from each other, defined by a device isolation region on a semiconductor substrate, and a transfer transistor including a first sub-gate provided on an upper surface of the semiconductor substrate and a second sub-gate extending within a recessed portion of the semiconductor substrate on the active region between the photoelectric conversion region and the floating diffusion region, wherein the photoelectric conversion region includes a plurality of photoelectric conversion elements, which vertically overlap each other within the semiconductor substrate and are spaced apart from the recessed portion.

The transfer transistor may be arranged at a pin body of the semiconductor substrate directly adjacent to the recessed portion and includes a side channel adapted to transport charges generated in the photoelectric conversion region to the floating diffusion region.

The transfer transistor may include a surface channel in the substrate adjacent to a lower surface of the first sub-gate and a buried channel in the substrate under the recessed portion.

The pin body may be provided between the recessed portion and the device isolation region adjacent to each other in a second direction crossing a first direction extending from the photoelectric conversion region to the floating diffusion region.

The plurality of photoelectric conversion elements may each include a first photoelectric conversion element directly adjacent to the upper surface of the semiconductor substrate and a second photoelectric conversion element under the first photoelectric conversion element, wherein the first photoelectric conversion element includes a first n-type impurity region and the second photoelectric conversion element includes a second n-type impurity region.

A distance between an edge of the first n-type impurity region and a sidewall of the recessed portion directly adjacent to the edge may be equal to or greater than about 30 nm.

The second photoelectric conversion element may extend below the recessed portion and a distance between an upper edge of the second photoelectric conversion element and a bottom of the recessed portion is equal to or greater than about 100 nm.

The recessed portion and the device isolation region, with a side channel therebetween, may be spaced by a first distance from a depth of the center of the first n-type impurity region.

The first distance may be equal to or greater than about 30 nm.

A thickness of the pin body may be equal to or greater than about 30 nm from a depth of the center of the first n-type impurity region.

The charges generated in the second photoelectric conversion element may be transported into the floating diffusion region through the side channel and the buried channel.

An upper surface of the pin body may be lower than the upper surface of the semiconductor substrate and an upper portion of the sidewall of the recessed portion may be in contact with the device isolation region directly above the side channel.

The image sensor may include a channel impurity region surrounding the second sub-gate in the semiconductor substrate directly adjacent to the recessed portion.

The recessed portion may be provided on the substrate directly adjacent to the device isolation region and may extend into the device isolation region adjacent to the substrate between the photoelectric conversion region and the floating diffusion region.

At least one sidewall and a bottom surface of the second sub-gate contact the device isolation region.

A sidewall of the device isolation region and a sidewall of the recessed portion may be slanted.

A distance between the sidewall of the device isolation region and the sidewall of the recessed portion may increase according to a depth of the semiconductor substrate.

The device isolation region may include a device isolation impurity region.

The device isolation region may include a device isolation layer including a dielectric material and a device isolation impurity region surrounding at least a portion of the device isolation layer.

The image sensor may further include an interlayer dielectric layer covering the semiconductor substrate, a planarization layer on the interlayer dielectric layer, a color filter on the planarization layer, and a micro lens on the color filter.

The plurality of photoelectric conversion elements may receive light of different wavelengths, and are adapted to generate charges.

The plurality of photoelectric conversion elements may be disposed at different depths corresponding to penetration depths of the light of different wavelengths.

A lowermost photoelectric conversion element may be disposed at a depth corresponding to a penetration depth of infrared wavelengths.

A pixel including the photoelectric conversion region and the floating active region has a size equal to or less than about 1 µm×1 µm, a total number of charges generated in the photoelectric conversion region may be equal to or greater than about 4000 and an image lag may be equal to or less than 5 e−.

BRIEF DESCRIPTION OF THE DRAWINGS

The above and other features and advantages will become more apparent to those of ordinary skill in the art by describing in detail exemplary embodiments with reference to the attached drawings, in which:

FIGS. 6A through 11A illustrate cross-sectional views of resulting structures from stages in the exemplary method of forming the exemplary structure corresponding to FIG. 3A, taken along the dotted line A-A' of FIG. 2;

FIGS. 6B through 11B illustrate cross-sectional views of the resulting structures from stages in the exemplary method of forming the exemplary structure of FIG. 3B, taken along the dotted line B-B' of FIG. 2;

FIGS. 24A through 25A illustrate cross-sectional views of resulting structures resulting from stages in an exemplary method of forming the exemplary structure corresponding to FIG. 23A, taken along the dotted line G-G' of FIG. 22;

FIGS. 24B through 25B illustrate cross-sectional views of resulting structures resulting from stages in an exemplary method of forming the exemplary structure corresponding to FIG. 2313, taken along the dotted line H-H' of FIG. 22;

DETAILED DESCRIPTION

Figure 1:
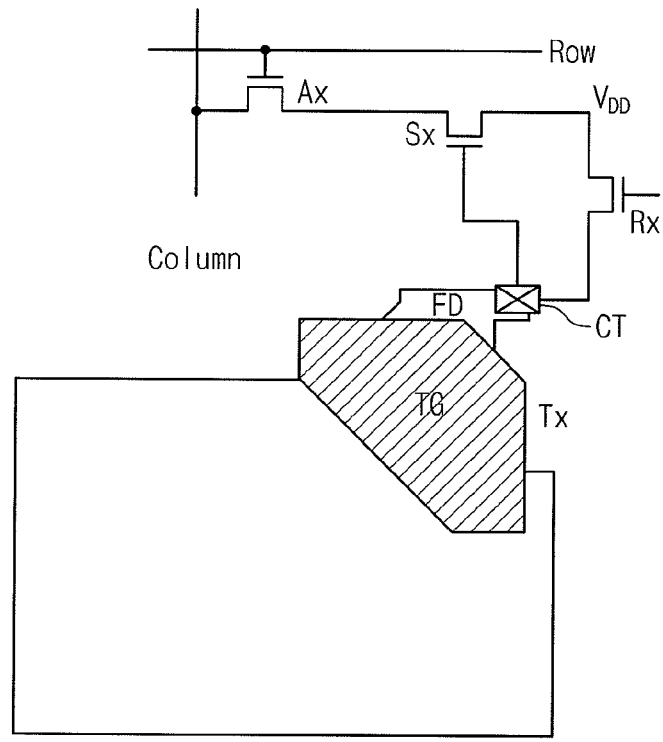
FIG. 1 illustrates a circuit diagram of an image sensor according to an exemplary embodiment.

Korean Patent Application No. 10-2009-0107122, filed on Nov. 6, 2009, and Korean Patent Application No. 10-2010-0083681, filed on Aug. 27, 2010, in the Korean Intellectual Property Office, and entitled: "Image Sensor," is incorporated by reference herein in its entirety.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when an element is referred to as being "on," "above", "below," or "under" another element, it can be directly "on," "above", "below," or "under" the other element, respectively, or intervening elements may also be present. In addition, it will also be understood that when an element is referred to as being "between" two elements, it can be the only element between the two elements, or one or more intervening elements may also be present.

It will be also be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. Like reference numerals refer to like elements throughout the specification.

Figure 2:
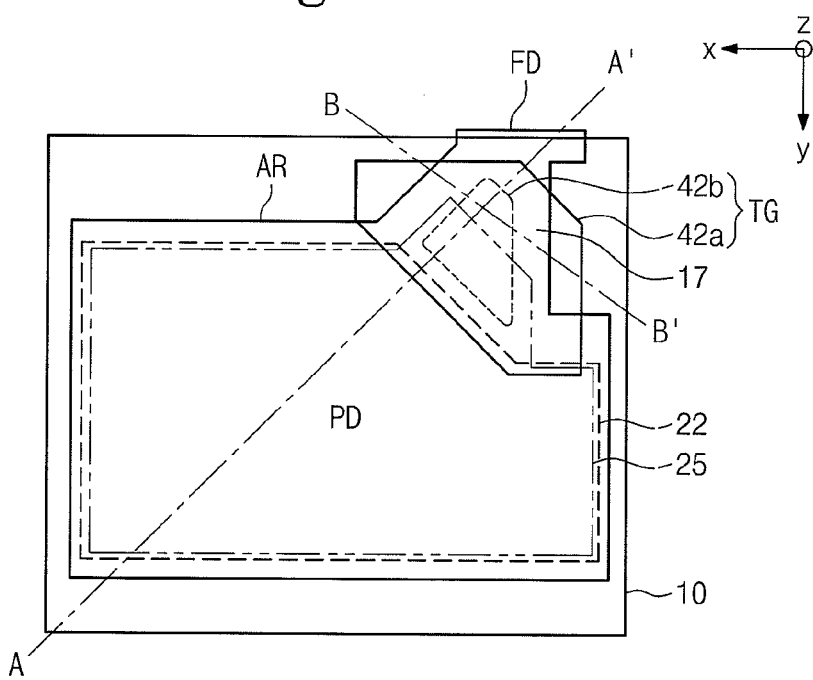
FIG. 2 illustrates a layout diagram of an exemplary embodiment of a pixel employable by the image sensor of FIG. 1.

FIG. 1 illustrates an exemplary embodiment of a circuit diagram of an image sensor. FIG. 2 illustrates a layout diagram of an exemplary embodiment of a pixel employable by the image sensor of FIG. 1.

Referring to FIGS. 1 and 2, the pixel of the image sensor may include a photoelectric conversion region PD, a transfer transistor Tx, a select transistor Sx, a reset transistor Rx, and an access transistor Ax. A plurality of photoelectric conversion elements (see, e.g., 23, 26 of FIG. 3A), which may vertically overlap with each other, may be provided in the photoelectric conversion region PD. More particularly, e.g., the photoelectric conversion elements may include photodiodes including an n-type impurity region (e.g., 22 in FIG. 3A) and a p-type impurity region (e.g., 21 in FIG. 3A). A transfer gate TG of the transfer transistor Tx may extend into a semiconductor substrate 10. A drain of the transfer transistor Tx may correspond to a floating diffusion region FD. The floating diffusion region FD may correspond to a source of the reset transistor Rx. The floating diffusion region FD, via contact CT, may be electrically configured to connect to the select gate of the selection transistor Sx. The select transistor Sx and the reset transistor Rx may be configured to be connected to each other in series. The select transistor Sx may be configured to be connected to the access transistor Ax. The reset transistor Rx, the select transistor Sx and the access transistor Ax may be shared with the neighboring pixels, thereby improving integration.

Hereinafter, an exemplary operation of the image sensor will be explained with reference to FIG. 1 as follows. Charges remaining in the floating diffusion region FD may be emitted by applying a supply voltage VDD to drains of the reset transistor Rx and the select transistor Sx in a light-blocked state. The reset transistor Rx may then be turned off and, when external light is radiated on the photoelectric conversion region PD, electron-hole pairs may be generated in the photoelectric conversion region PD. Holes may move toward the p-type impurity region and electrons may move toward the n-type impurity region and holes and electrons may respectively accumulate therein. When the transfer transistor Tx is in an on-state, charges such as electrons and holes may be transported to the floating diffusion region FD and may accumulate therein. A gate bias of the select transistor Sx may vary based on a number of charges accumulated in the floating diffusion region FD, and may thereby cause a change in a source voltage of the select transistor Sx. At this point, a signal corresponding to the accumulated charges may be read out through a column line by turning on the access transistor Ax.

As integration of the image sensor advances, a size of the photoelectric conversion region PD may get smaller, and a quantity of light that may be received may be reduced. In embodiments, a plurality of photoelectric conversion elements (see, e.g., 23, 26 of FIG. 3A) may be arranged in a vertically overlapping manner in the photoelectric conversion region PD. By forming the transfer gate TG of the transfer transistor TX such that it may extend into the semiconductor substrate 10, charges generated in each of the plurality of photoelectric conversion elements may be easily transported into the floating diffusion region FD. Accordingly, in embodiments, a quantity of light received may be increased even though, e.g., a cross-sectional area of the photoelectric conversion region PD may be reduced. More particularly, e.g., in embodiments, by providing a plurality of photoelectric conversion elements in a partially and/or completely overlapping manner relative to a z-direction, while a cross-sectional area of the photoelectric conversion region PD along an x-y plane may be reduced, a quantity of light received may be increased.

Figure 3A:
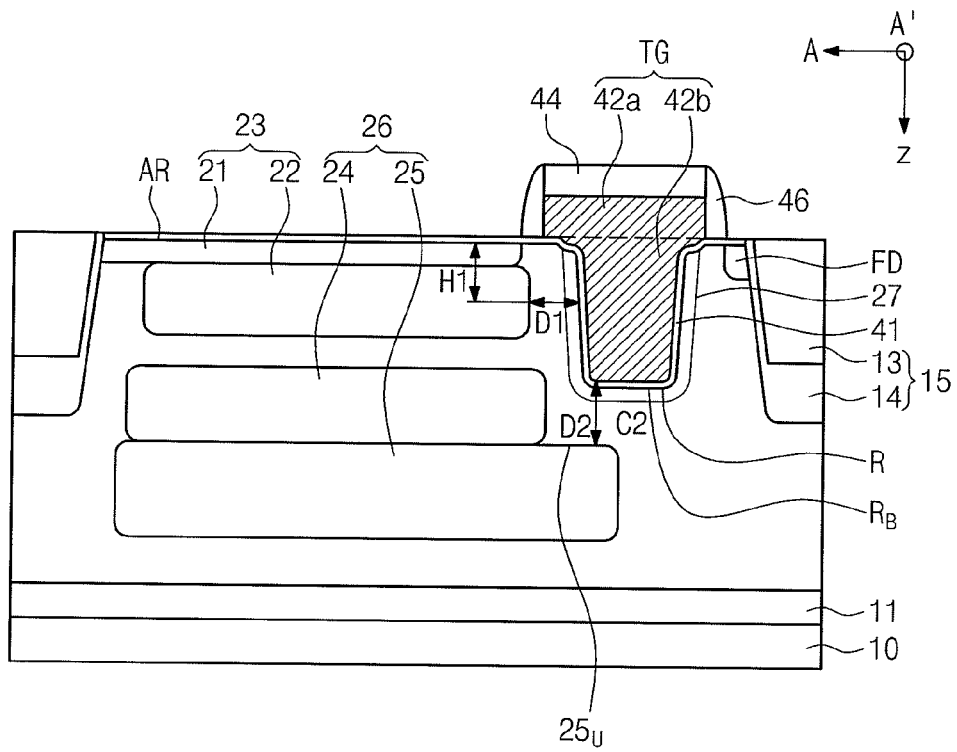
FIG. 3A illustrates a cross-sectional view of the pixel of FIG. 2, taken along the dotted line A-A' of FIG. 2.
Figure 3B:
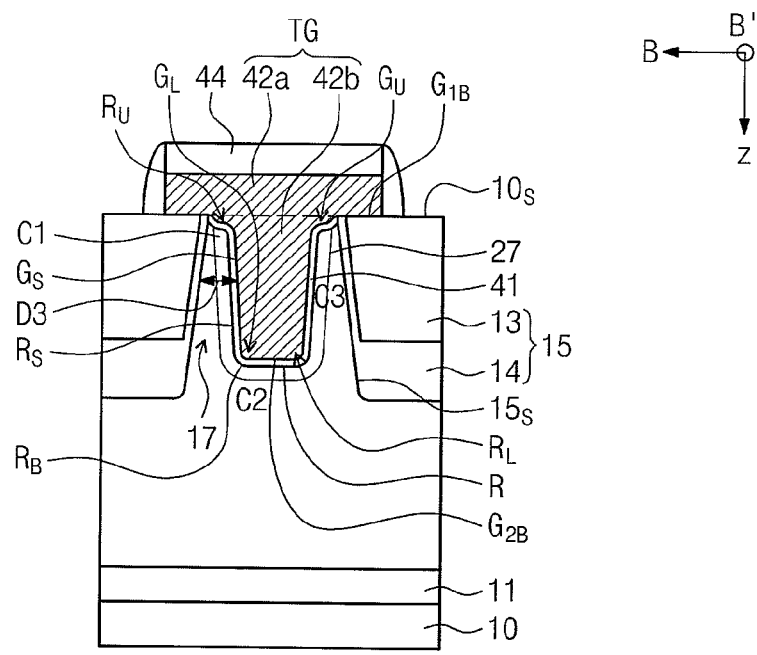
FIG. 3B illustrates a cross-sectional view of the pixel of FIG. 2, taken along the dotted line B-B' of FIG. 2.
Figure 4:
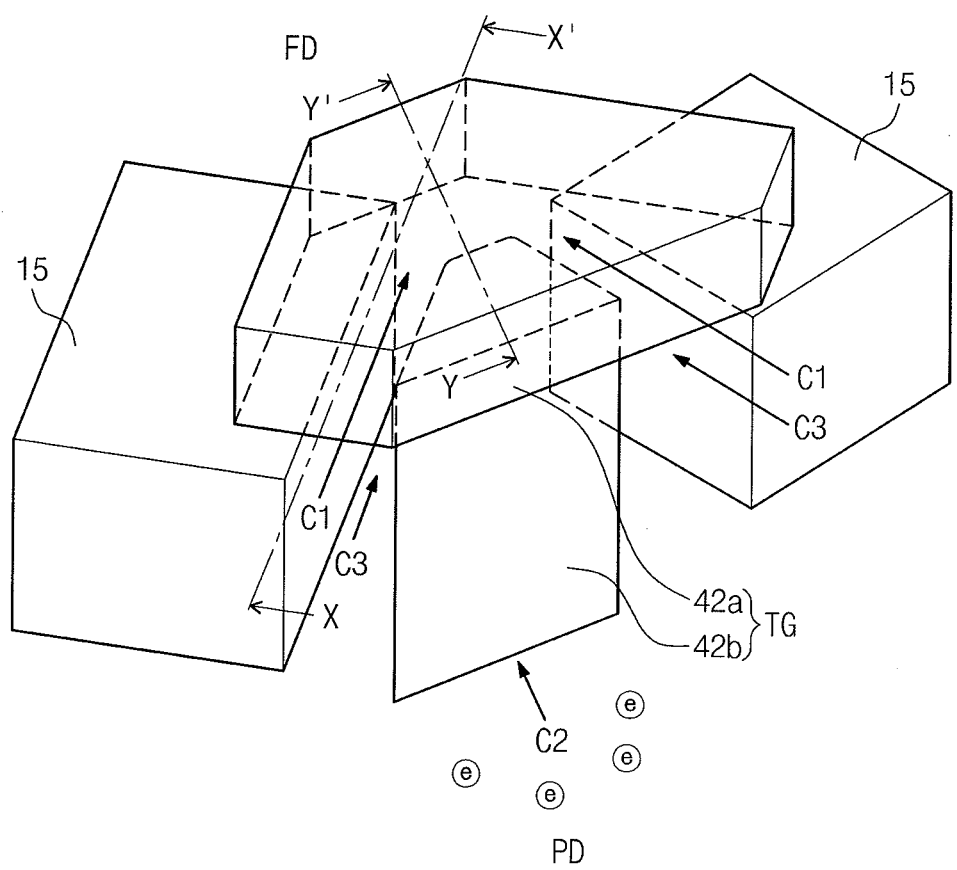
FIG. 4 illustrates a plan view of a portion of the pixel of FIG. 2.
Figure 5A:
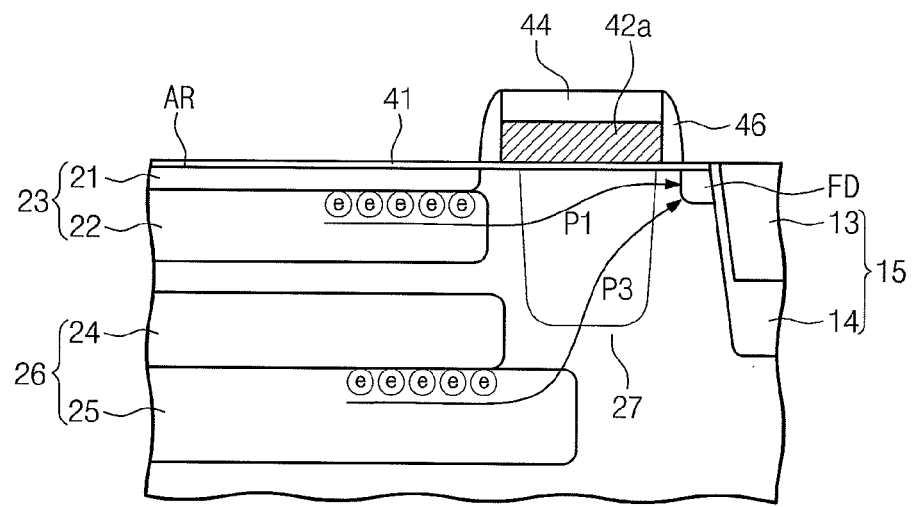
FIG. 5A illustrates a cross-sectional view of the portion of the pixel of FIG. 2, taken along the dotted line X-X' of FIG. 4.
Figure 5B:
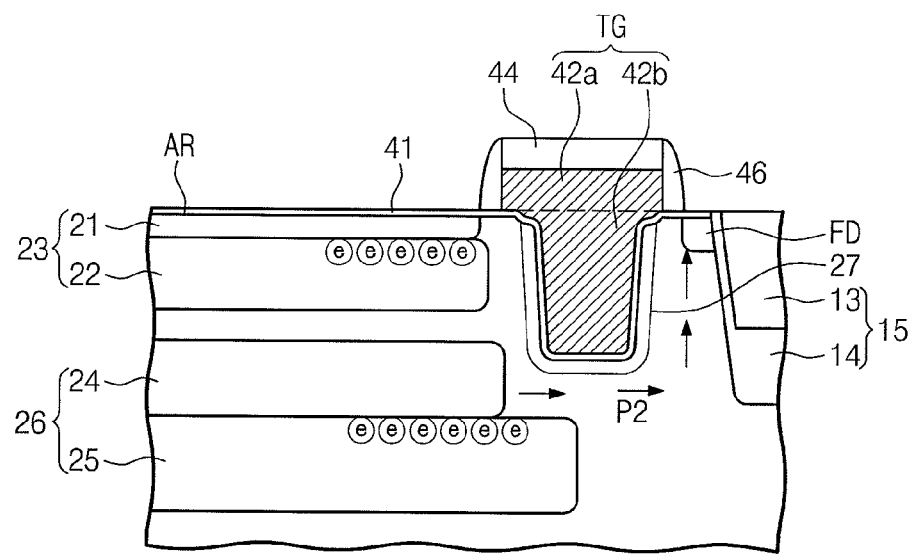
FIG. 5B illustrates a cross-sectional view of the portion of the pixel of FIG. 2, taken along the dotted line Y-Y' of FIG. 4.

Hereinafter, an exemplary embodiment of an image sensor employing one or more aspects of the invention will be explained. Referring still to FIGS. 1 and 2, the select transistor Sx, the reset transistor Rx, and the access transistor Ax illustrated in FIG. 1 are omitted from the exemplary layout diagram of FIG. 2. FIG. 3A illustrate a cross-sectional diagram of the exemplary pixel of FIG. 2, taken along the dotted line A-A' of FIG. 2. FIG. 3B illustrates a cross-sectional diagram of the exemplary pixel of FIG. 2, taken along the dotted line B-B' of FIG. 2. FIG. 4 illustrates a plan view of a portion of the pixel of FIG. 2. FIG. 5A illustrates a cross-sectional view of the portion of the pixel of FIG. 2, taken along the dotted line X-X' of FIG. 4. FIG. 5B illustrates a cross-sectional view of the portion of the pixel of FIG. 2, taken along the dotted line Y-Y' of FIG. 4.

Referring to FIGS. 2, 3A and 3B, the semiconductor substrate 10 may be provided. The semiconductor substrate 10 may be p-type. More particularly, e.g., the semiconductor substrate 10 may include a p-type silicon wafer and an epitaxial layer formed thereon. A deep well 11 may be provided in the semiconductor substrate 10. The deep well 11 may have a higher p-type impurity density than the semiconductor substrate 10. As discussed above, a plurality of pixels may be provided in the semiconductor substrate 10. More particularly, e.g., pixels that are adapted to implement different colors, e.g., red, green, and blue, may provided in the semiconductor substrate 10. A device isolation region 15 may be provided in the semiconductor substrate 10. The device isolation region 15 may define an active region AR and may separate respective ones of the pixels.

The device isolation region 15 may include a device isolation layer 13 and a device isolation impurity region 14. The device isolation layer 13 may include a dielectric material. The device isolation layer 13 may be embedded in the device isolation impurity region 14. The device isolation impurity region 14 may surround at least a portion of the device isolation layer 13. While the exemplary embodiment illustrated in FIGS. 3A and 3B illustrate the device isolation region 15 including the device isolation layer 13, embodiments are not limited thereto. More particularly, e.g., in some embodiments, the device isolation region 15 may not include the device isolation layer 13 in order to minimize generation of a dark region. The device isolation impurity region 14 may have a higher p-type impurity doping density than the semiconductor substrate 10. To reduce and/or eliminate cross talk problems, a depth of the device isolation region 15 along the z-direction may be deeper than a depth of the transfer gate TG along the z-direction. In embodiments, the depth of the device isolation region 15 along the z-direction may be deeper than a depth along the z-direction of a lowermost photoelectric conversion element, e.g., 26, among the plurality of photoelectric conversion elements 23, 26. A sidewall 15s of the device isolation region 15 may be slanted. A slope of the sidewall 15s of the device isolation region 15 may be, e.g., approximately 82° to approximately 88°.

Referring to FIG. 2, the plurality of photoelectric conversion elements 23, 26, which vertically overlap each other, may be provided in the active region AR on the semiconductor substrate 10. In the following description while the two photoelectric conversion elements 23, 26 are described, more than two photoelectric conversion elements may be provided. Further, in the following description, for simplicity, the photoelectric conversion elements 23, 26 will be referred to as the first photoelectric conversion element 23 and the second photoelectric conversion element 26.

The first photoelectric conversion element 23 may include a first n-type impurity region 22. The first n-type impurity region 22 may form a PN junction with the p-type semiconductor substrate 10, and may thereby constitute a photodiode. In some embodiments, the first photoelectric conversion element 23 may further include a first p-type impurity region 21 adjoining the first n-type impurity region 22. The first p-type impurity region 21 may have a higher p-type impurity doping density than the semiconductor substrate 10.

The second photoelectric conversion element 26 may be provided so as to be partially and/or completely overlapping, e.g., partially and/or completely under, the first photoelectric conversion element 23. The second photoelectric conversion element 36 may include a second n-type impurity region 25. The second n-type impurity region 25 may form a PN junction with the p-type semiconductor substrate 10, and may thereby constitute a photodiode. In some embodiments, the second photoelectric conversion element 26 may further include a second p-type impurity region 24 adjoining the second n-type impurity region 25. The second p-type impurity region 24 may have a higher p-type impurity doping density than the semiconductor substrate 10.

The floating diffusion region FD may be provided in the active region AR on the semiconductor substrate 10. The floating diffusion region FD may be separate from the photoelectric conversion region PD. For example, the floating diffusion region FD may be doped with n-type impurities.

The transfer gate TG may be provided on the active region AR between the photoelectric conversion region PD and the floating diffusion region FD. A portion of the semiconductor substrate 10 under the transfer gate TG may be recessed. The recessed portion R may include a slanted sidewall Rs. A slope of the sidewall Rs may be, e.g., approximately 82° to approximately 88°. A lower region $R_L$, e.g., lower corner, formed by the sidewall Rs and a bottom $R_B$ of the recessed portion R may be rounded. An upper region $R_U$, e.g., upper corner, of the recessed portion R may be rounded.

The transfer transistor TG may include a first sub-gate 42a and a second sub-gate 42b. The first sub-gate 42a may be arranged on an upper surface 10u of the semiconductor substrate 10, and may protrude above the semiconductor substrate 10. More particularly, e.g., the first sub-gate 42a may extend upward along the z-direction from an upper surface 10u of the semiconductor substrate 10. The second sub-gate 42b may extend into the recessed portion R of the semiconductor substrate 10. More particularly, e.g., the second sub-gate 42b may extend downward into the recessed portion R of the semiconductor substrate 10. The second sub-gate 42b may substantially and/or completely fill the recessed portion R. A lower gate region $G_L$, e.g., lower corner, defined by a sidewall and a bottom of the second sub-gate 42b and corresponding to the lower region $R_L$ of the recessed portion R of the semiconductor substrate 10 may be rounded. The first sub-gate 42a and the second sub-gate 42b may have different widths, e.g., along the x-y direction illustrated, relative to each other. An upper gate region $G_U$, e.g., upper corner, defined by a bottom portion of the first sub-gate 42a and the sidewall of the second sub-gate 42b and corresponding to the upper region $R_U$ of the recessed portion R of the semiconductor substrate 10 may be rounded.

A gate dielectric layer 41 may be interposed between the transfer gate TG and the semiconductor substrate 10. In embodiments, by providing rounded regions, e.g., rounded corners, degradation of the gate dielectric layer 41, which may occur as a result of electric field crowding at a sharp corner, may be reduced and/or prevented. As a result, an image sensor including such features may have improved reliability.

A channel impurity region 27 may be provided in the semiconductor substrate 10. The channel impurity region 27 may be directly adjacent to the recessed portion R. The channel impurity region 27 may surround the second sub-gate 42b. By using the channel impurity region 27, a threshold voltage of the transfer transistor Tx may be adjusted. The channel impurity region 27 may have a higher p-type impurity doping density than the semiconductor substrate 10. A capping layer pattern 44 may be provided on the first sub-gate 42a and a spacer 46 may be provided on the sidewall of first sub-gate 42a.

A pin body 17 may be provided in the semiconductor substrate 10. The pin body 17 may correspond to a portion of the semiconductor substrate 10 where the recessed portion R and the device isolation region 15 adjoin each other along a direction crossing the x-y directions, e.g., line B-B' of FIG. 2 corresponding to FIG. 3B. More particularly, e.g., the pin body 17 may correspond to a portion of the semiconductor substrate 10 along a second direction crossing a first direction corresponding to line from the photoelectric conversion region PD to the floating diffusion region FD. The pin body 17 may be provided in a portion of the semiconductor substrate 10 directly adjacent to the recessed portion R.

Referring to FIGS. 3A, 3B and 4, the first n-type impurity region 22 may be separated from the sidewall Rs of the recessed portion R by a first distance D1 at a depth H1. The depth H1 may correspond to a center of the first n-type impurity region 22 relative to the z-direction. The first distance D1 may be, e.g., approximately and/or exactly 40 nm. A portion of the second n-type impurity region 25 may extend below the transfer gate TG. An upper surface 25u of the second n-type impurity region 25 and the bottom surface $R_B$ of the recessed portion R may be separated from each other by a second distance D2. The second distance D2 may be, e.g., approximately 100 nm to approximately 300 nm, including exactly 100 nm and exactly 300 nm.

A distance between the device isolation region 15 and the recessed portion R may increase according to a depth of the semiconductor substrate 10 along the z-direction. That is, e.g., a thickness of the pin body 17 along the x-direction may increase according to the depth of the semiconductor substrate 10 along the z-direction. For example, at the depth H1 corresponding to the center of the first n-type impurity region 22 relative to the z-direction, the sidewall 15s of the device isolation region 15 and the sidewall Rs of the recessed portion R may be separated by a third distance D3. The third distance D3 may be, e.g., equal to or greater than approximately 30 nm.

If the third distance D3 is too small, a leakage current may be generated in the side channel C3. For example, a thickness along an x-y direction of a side channel C3, which will be explained below, may be approximately 10 nm. Similarly, at the depth H1 of the center of the first n-type impurity region 22, the thickness of the pin body 17 may be 30 nm.

Referring to FIG. 4, the transfer transistor Tx may include a plurality of, e.g., (three) channels. More particularly, e.g., the transfer transistor Tx may include a surface channel C1, a buried channel C2, and a side channel C3. The surface channel C1 may adjoin a bottom surface $G_{1B}$ of the first sub-gate 42a. The buried channel C2 may be under a bottom surface $G_{2B}$ of the second sub-gate 42b. The side channel C3 may be between the sidewall Gs of the second sub-gate 42b and the device isolation region 15. The side channel C3 may be formed in the pin body 17 in the semiconductor substrate 10 directly adjacent to the recessed portion R. Embodiments may have a structure enabling the transfer transistor Tx to have a larger channel area as compared to comparable conventional devices, and thus, embodiments may enable charge transport from the photoelectric conversion region PD to the floating diffusion region FD to be facilitated.

Hereinafter, charge generation and transport of an exemplary embodiment of an image sensor including one or more features of the inventive concept will be explained.

Light incident onto the photoelectric conversion region PD does not stop at a particular depth. Although an intensity of the incident light may vary depending on depths of incidence, at least some of the incident light continues to progress into the semiconductor substrate 10. For example, a blue light having a wavelength of approximately 470 nm may have a peak intensity mainly at a portion adjacent to a surface 10s (see FIG. 3B) of the semiconductor substrate 10, e.g., at the first photoelectric conversion element 23. Charge generation may be most active at the portion adjacent to the surface 10s of the semiconductor substrate 10, e.g., at the first photoelectric conversion element 23. Some of the blue light may progress further into the semiconductor substrate 10, and may be incident upon a portion deeper than the first photoelectric conversion element 23, e.g., upon the second photoelectric conversion element 26. Charges generated in the second photoelectric conversion element 26 may be less than charge generation in the first photoelectric conversion element 23. That is, while charge generation may be most active closer to the surface 10s, charge generation may still occur in the photoelectric conversion elements arranged further below, e.g., the second photoelectric conversion element 26.

Referring to FIGS. 4, 5A and 5B, the charges (e) generated in the photoelectric conversion elements 23, 26 may flow into the floating diffusion region FD through the channels C1, C2, C3 of the transfer transistor Tx. The charges generated in the first photoelectric conversion element 23 may quickly flow into the floating diffusion region FD through the surface channel C1 and the side channel C3 (see path P1). The charges generated in the second photoelectric conversion element 26 may flow into the floating diffusion region FD through the buried channel C2 and the side channel C3 (see paths P2, P3).

In embodiments, a number of charges generated by the incident light may be increase, e.g., maximized, by arranging the plurality of photoelectric conversion elements, e.g., 23, 26, in a completely and/or partially vertically overlapping manner. In embodiments, the transfer gate TG may extend into the semiconductor substrate 10 and may be isolated by the device isolation region 15 such that the side channel C3 in addition to the surface channel C1 and the buried channel C2 may be additionally formed. Accordingly, charges generated in the photoelectric conversion elements, e.g., 23, 26, may be transported easily and quickly. More particularly, e.g., charges generated in the second photoelectric conversion element 26 may be transported faster through the side channel C3 than through the buried channel C2. An image sensor according including one or more features described herein may be very effective for delivering electric signals more quickly and reducing image lags and dead zone problems, as compared to comparable conventional devices.

Hereinafter, simulation results from an exemplary image sensor employing one or more aspects of the inventive concept will be explained. In the exemplary embodiment, a size of a pixel is 1.4 um×1.4 um, full well capacitance (FWC), which corresponds to a total number of charges that can be generated in the photoelectric conversion elements, is equal to or greater than 13,000 and lag is smaller than 10 e–. Occurrence of cross talk is less than 1%. In another exemplary embodiment, a size of a pixel is 0.9 um×0.9 um, full well capacitance (FWC) is equal to or greater than 4,000 and lag is smaller than 5 e–. Occurrence of cross talk is less than 10%.

Embodiments of an image sensor including a plurality of vertically overlapping photoelectric conversion regions and a transfer gate extending into a semiconductor substrate, may generate many signal chargers and improve sensing margins as compared to comparable conventional devices.

Embodiments of an image sensor including a transfer transistor that includes a surface channel, a side channel and a buried channel, such that a transport speed of signal charges may be enhanced and/or image lag can may be reduced and/or substantially avoided.

An exemplary method of forming an image sensor including, e.g., the exemplary unit pixel of FIG. 2 will be explained. FIGS. 6A through 11A illustrate cross-sectional views of resulting structures from stages in the exemplary method of forming the exemplary structure corresponding to FIG. 3A, taken along the dotted line A-A' of FIG. 2. FIGS. 6B through 11B illustrate cross-sectional views of the resulting structures from stages in the exemplary method of foaming the exemplary structure of FIG. 3B, taken along the dotted line B-B' of FIG. 2.

Figure 6A:
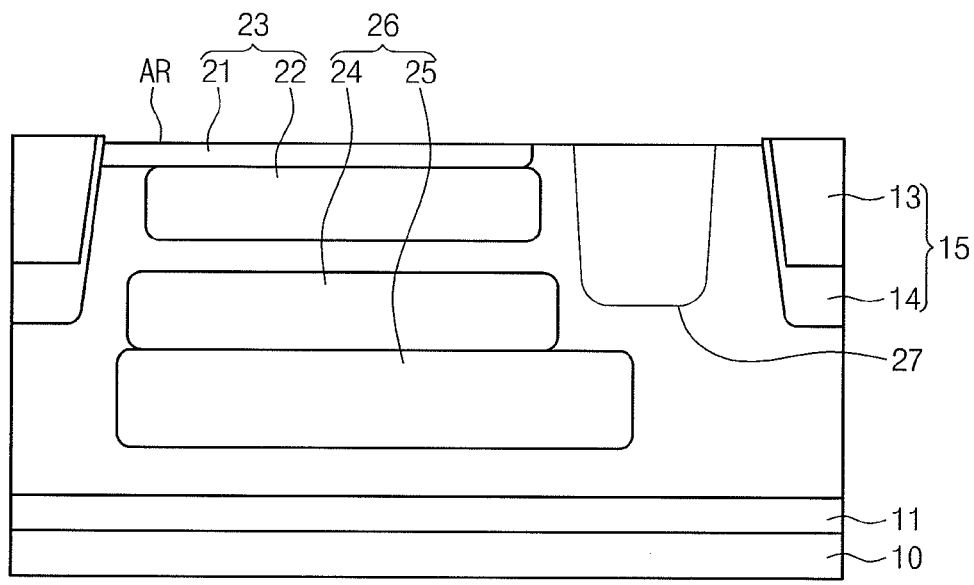
Figure 6B:
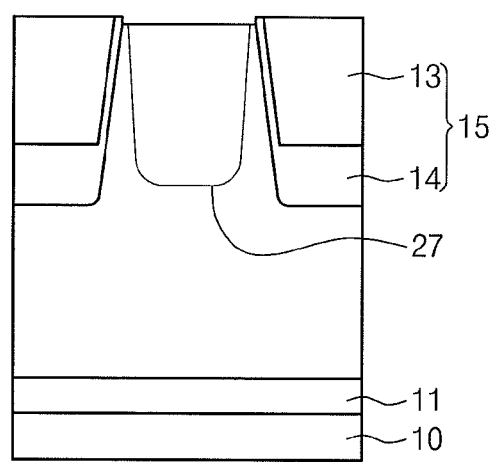

Referring to FIGS. 6A and 6B, the deep well 11 may be formed in a portion of a semiconductor substrate 10, where pixels may later be formed. The semiconductor substrate 10 may be p-type and the deep well 11 may doped with a higher p-type impurity concentration than the semiconductor substrate 10. The active region AR may be defined by forming the device isolation layer 15 on the semiconductor substrate 10. The device isolation layer 15 may be formed, e.g., by filling a trench formed by shallow trench isolation (STI) method with a dielectric material, and may include the device isolation layer 13. The device isolation layer 13 may have a slanted sidewall. The device isolation impurity region 14 may be formed to surround at least a portion of the device isolation layer 13. The device isolation impurity region 14 may have a higher p-type impurity doping density than the semiconductor substrate 10. After forming a trench, the device isolation impurity region 14 may be formed by doping an inner wall of the trench with a high density of p-type impurity ions. In embodiments including the device isolation layer 13, the device isolation layer 13 may be formed after forming the device isolation impurity region 14.

In some embodiments, only the device isolation impurity region 14 may exist for isolating pixels, e.g., without forming the trench and/or the device isolation layer 13.

Referring still to FIGS. 6A and 6B, the plurality of photoelectric conversion elements 23, 26 vertically overlapping each other may be formed within the active region AR. The plurality of photoelectric conversion elements 23, 26 may be formed by performing multiple ion-implantations using multiple ion-implantation masks. The first photoelectric conversion elements 23 may include the first n-type impurity region 22. The first photoelectric conversion elements 23 may further include the first p-type impurity region 21 adjoining the first n-type impurity region 22. The first p-type impurity region 21 may have a higher p-type impurity doping density than the semiconductor substrate 10. The second photoelectric conversion elements 26 provided under the first photoelectric conversion elements 23 may include the second n-type impurity region 25. The second photoelectric conversion elements 26 may further include the second p-type impurity region 24 adjoining the second n-type impurity region 25. The second p-type impurity region 24 may have a higher p-type impurity doping density than the semiconductor substrate 10.

The channel impurity region 27 may be formed, through an ion implantation at an area on where a transfer transistor Tx may later be formed. The channel impurity region 27 may be, for example, doped with p-type impurities.

Figure 7A:
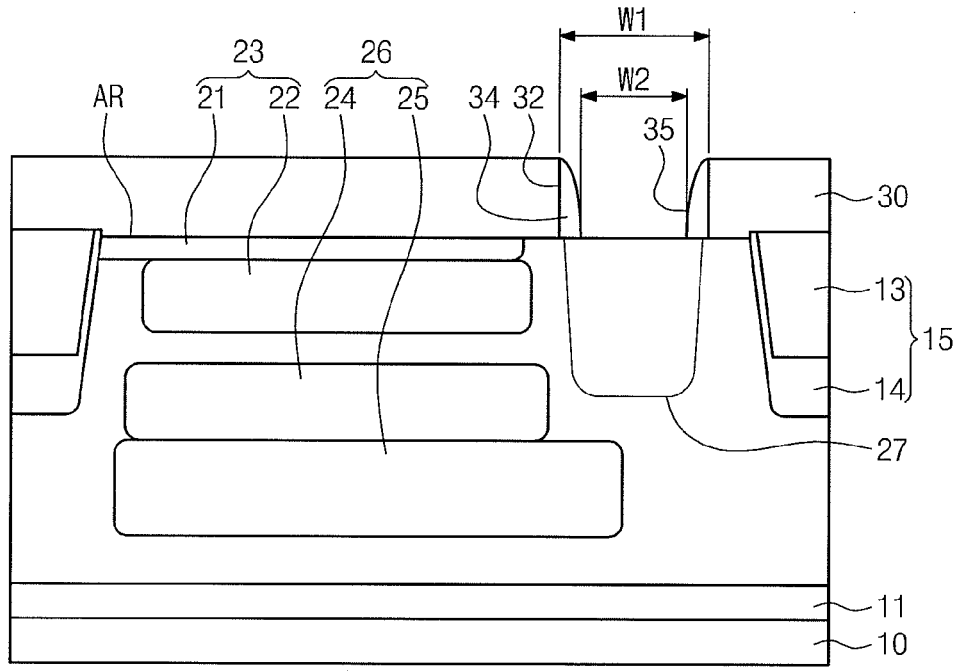
Figure 7B:
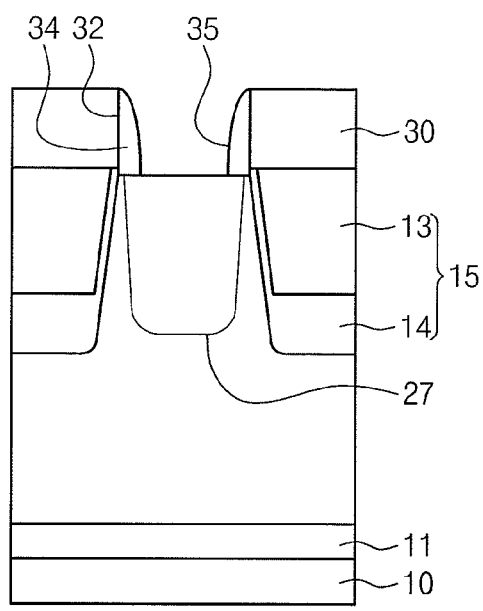

Referring to FIGS. 7A and 7B, a mask pattern 30 may be formed on the semiconductor substrate 10. The mask pattern 30 may be formed to include a first opening 32 exposing the semiconductor substrate 10 at a location of the channel impurity region 27. A sacrificial spacer 34 may be formed on sidewalls of the first opening 32 of the mask pattern 30. The sacrificial spacer 34 may include, e.g., silicon oxide. As shown in FIG. 7A, a width W2 of a second opening 35 defined by the sacrificial spacer 34 is narrower than a width W1 of the first opening 32.

Figure 8A:
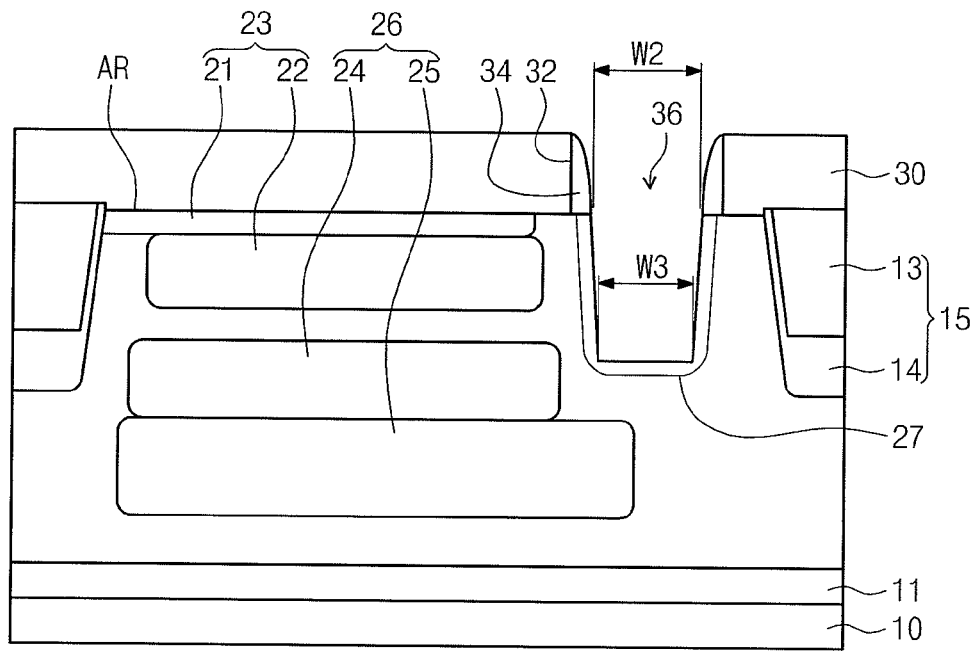
Figure 8B:
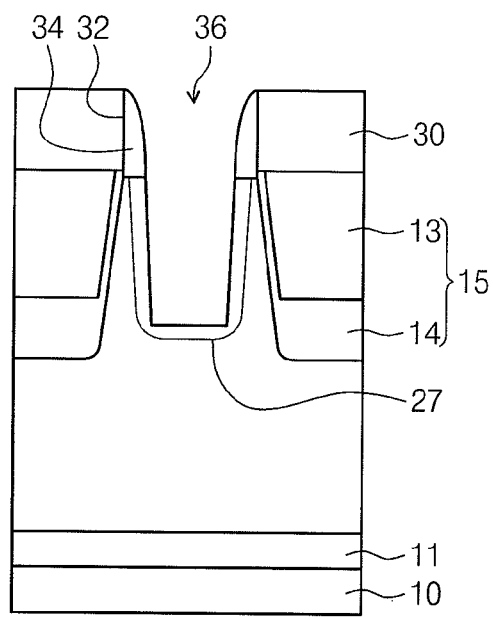

Referring to FIGS. 8A and 8B, using the mask pattern 30 and the sacrificial spacer 34 as etch masks, a trench 36 may be formed by anisotropic etching the semiconductor substrate 10 at the location of the channel impurity region 27. The bottom of the trench 36 may be formed to have a width W3, where the width W3 may be narrower than the width W2 of the second opening 35. As a result, an inner sidewall of the trench 36 may be formed to be slanted. A slope of a sidewall of the trench 36 may be approximately and/or exactly 82° to approximately and/or exactly 88°. A depth of the trench 36 along the z-directly may be shallower than a depth of the channel impurity region 27 along the z-direction.

Figure 9A:
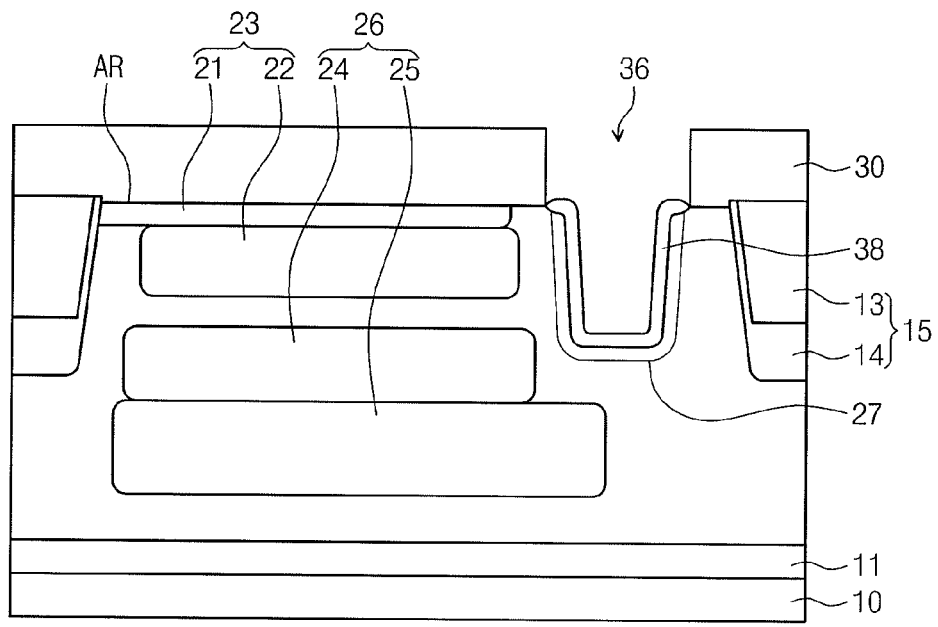
Figure 9B:
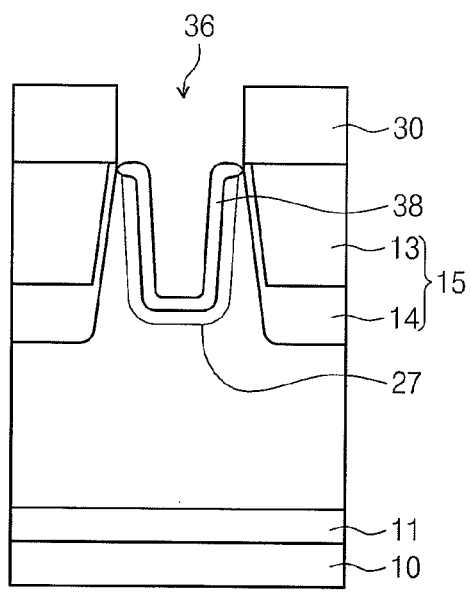

Referring to FIGS. 9A and 9B, the sacrificial spacer 34 may be selectively removed. A portion of the upper surface 10s of the semiconductor substrate 10 located under the sacrificial spacer 34 may be exposed. Then, thermal oxidation may be performed to form a thermal oxide layer 38 on the sidewalls and bottom of the trench 36 and the upper surface 10s of the semiconductor substrate 10 that is exposed. Because oxygen may not be smoothly supplied to the bottom edge regions, e.g., bottom corners, of the trench 36 compared to the sidewall and bottom surface of the trench 36, the thermal oxide layer 38 may be formed relatively thick at the sidewall and bottom of the trench 36 and relatively thin at the bottom edge regions. Because more oxygen is supplied to upper regions, the thermal oxide layer 38 may be formed even thicker at upper edge regions of the trench 36. As a result, the upper edge regions and the bottom edge regions of the trench 36 may be rounded. The thermal oxide layer 36 formed by thermal oxidation process may cure etch damages caused by the anisotropic etching process as well. A thickness of the thermal oxide layer 38 may be adjusted so as to leave a portion of the channel impurity region 27.

Figure 10A:
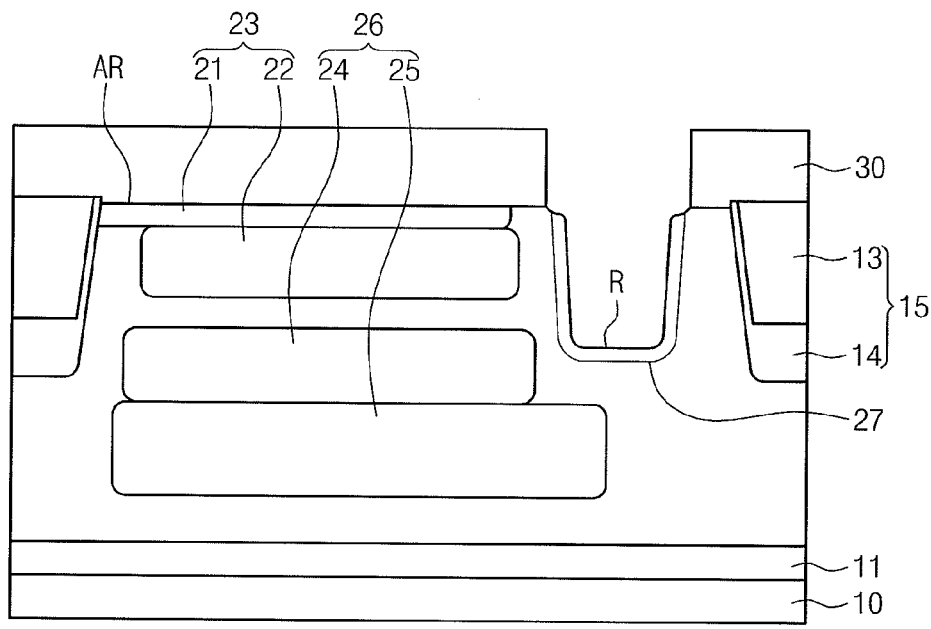
Figure 10B:
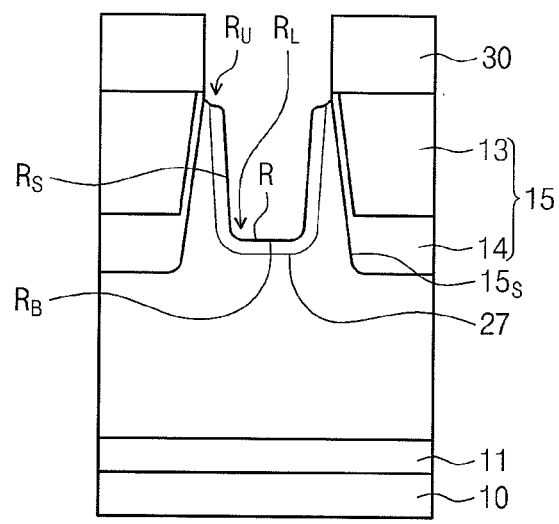

Referring FIGS. 10A and 10B, the thermal oxide layer 38 may be removed by performing a wet etching process. The thermal oxidation process and the wet etching process may be alternatively repeated. As a result, the bottom edge regions and the upper edge regions may have a more rounded shape. Accordingly, the recessed portion R having rounded bottom regions $R_B$, e.g., bottom corners, and rounded upper edge regions $R_U$, e.g., upper corners, may be formed. An oblique ion-implantation process with respect to the semiconductor substrate 10 may be further performed on the sidewall Rs and bottom $R_B$ of the recessed portion R. In other words, the channel impurity region 27 may not be formed at the stages corresponding to FIGS. 6A and 6B, but formed by an oblique ion-implantation during the stages of the exemplary method corresponding to FIGS. 10A and 10B.

Figure 11A:
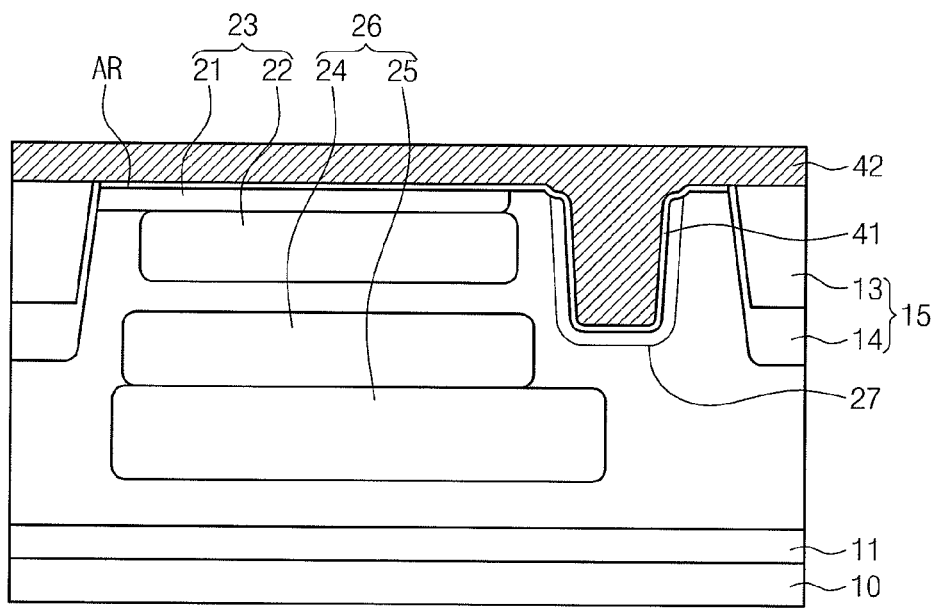
Figure 11B:
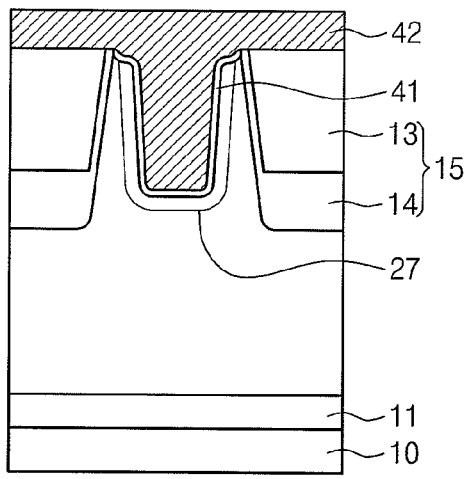

Referring to FIGS. 11A and 11B, the mask pattern 30 may be removed. By performing a thermal oxidation process, the gate dielectric layer 41 may be formed on the semiconductor substrate 10. The gate dielectric layer 41 may be formed conformally along the sidewall Rs and bottom $R_B$ of the recessed portion R. A gate layer 42 may be formed on the semiconductor substrate 10 to fill the recessed portion R. The gate layer 42 may include, e.g., polysilicon, metal silicide, metal nitride and/or metal, etc.

Referring to FIGS. 3A and 3B, a capping layer pattern 44 may be formed on the gate layer 42 overlapping the recessed portion R. Using the capping layer pattern 44 as an etching mask, the gate layer 42 may be etched to form a transfer gate TG. At this point, portions of the gate dielectric layer 41 may also be etched. Then, the spacer 46 covering the sidewall of the transfer gate TG may be formed. Thereafter, using the spacer 46 and a mask covering the photoelectric conversion region PD as ion-implantation masks, the floating diffusion region FD may be formed on another side of the transfer gate TG opposing the photoelectric conversion region PD.

Figure 12:
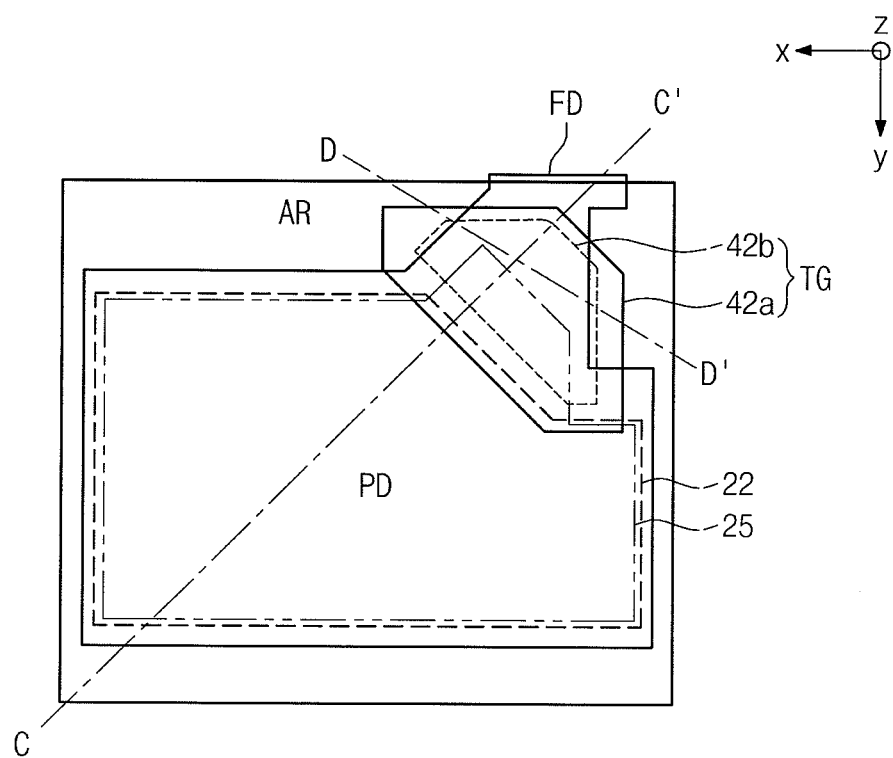
FIG. 12 illustrates a layout diagram of another exemplary embodiment of a pixel employable by the image sensor of FIG. 1.
Figure 13A:
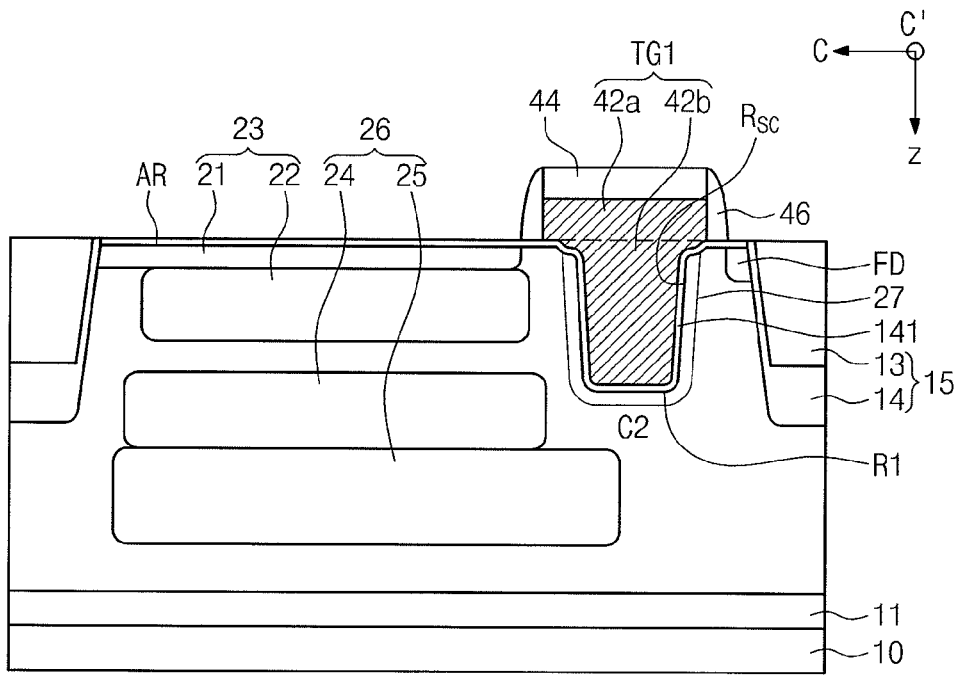
FIG. 13A illustrates a cross-sectional view of the pixel of FIG. 12, taken along the dotted line C-C' of FIG. 12.
Figure 13B:
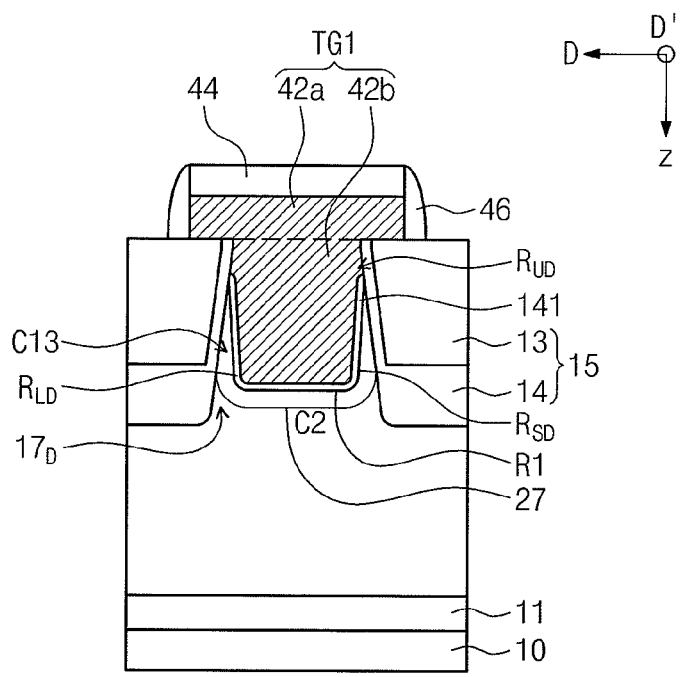
FIG. 13B illustrates a cross-sectional view of the pixel of FIG. 12, taken along the dotted line D-D' of FIG. 12.

An image sensor according to another example embodiment of the present inventive concept will be explained. FIG. 12 illustrates a layout diagram of another exemplary embodiment of a pixel employable by the image sensor of FIG. 1. FIG. 13A illustrates a cross-sectional view of the pixel of FIG. 12, taken along the dotted line C-C' of FIG. 12. FIG. 13B illustrates a cross-sectional view of the pixel of FIG. 12, taken along the dotted line D-D' of FIG. 12. In general, only differences between the exemplary embodiment of FIGS. 12-13B and the exemplary embodiment of FIGS. 2-3B will be described. Detailed explanation with respect to overlapping technical features, as explained referring to FIGS. 3A and 3B, will be omitted.

Referring to FIGS. 12, 13A and 13B, side surfaces $R_{SC}$ of a recessed region R1 facing each other in C-C' direction of FIG. 12 may be separated from the device isolation region 15, as shown in FIG. 13A. Upper portions $R_{UD}$ of other side surfaces $R_{SD}$ of the recessed region R1 facing each other in D-D' direction of FIG. 12 may contact the device isolation region 15 and bottom portions $R_{LD}$ thereof may be separated from the device isolation region 15, as shown in FIG. 13B. In such embodiments, a pin body 17D of this embodiment may be thinner than the pin body 17 of FIG. 3B. An upper portion of the pin body 17D may be lower relative to the z-axis than the upper portion of the upper surface 10s of the semiconductor substrate 10. Accordingly, a side channel C13 may be formed in the pin body 17D adjoining lower portions of other sidewalls of the recessed region R1. In such embodiments, the side channel C13 may be thinner than the side channel C3 described above with reference to FIG. 3B. In such embodiments, the surface channel C1, described above with reference to FIG. 3B, is not formed.

In an image sensor according to the exemplary embodiment illustrated in FIGS. 12-13B, charges generated in the photoelectric conversion elements 23, 26 may be transported into the floating diffusion region FD through the side channel C13 and the buried channel C2.

Figure 14A:
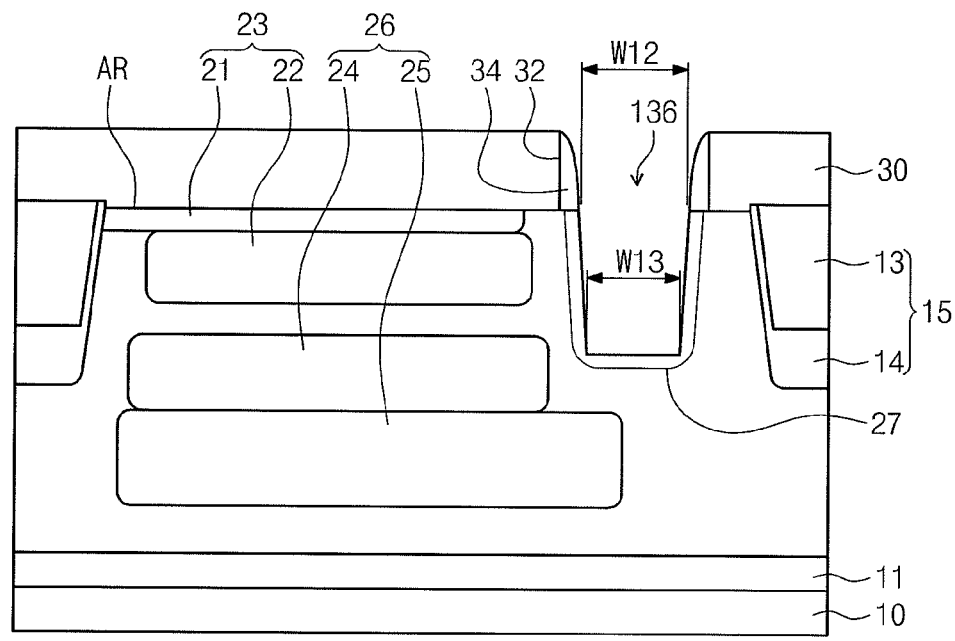
FIGS. 14A, 15A, 16A illustrate cross sectional views of resulting structures from stages in the exemplary method of forming the exemplary structure corresponding to FIG. 13A, taken along the dotted line C-C' of FIG. 12.
Figure 14B:
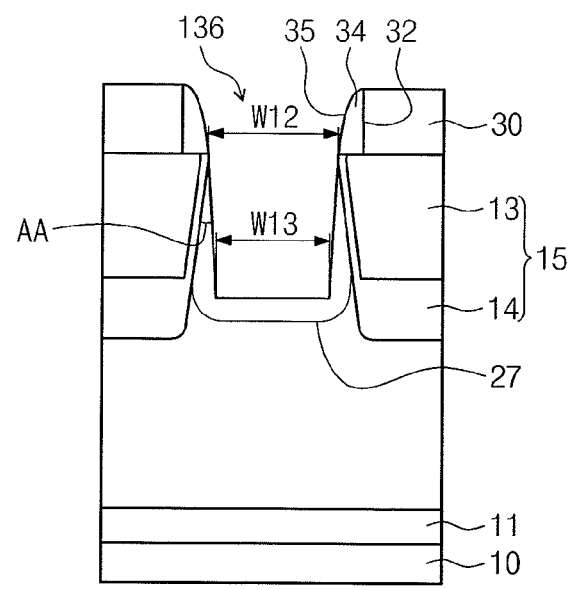
FIGS. 14B, 15B, and 16B illustrate cross sectional views of resulting structures from stages in the exemplary method of forming the exemplary structure corresponding to FIG. 13B, as taken along the dotted line D-D' of FIG. 12.
Figure 15A:
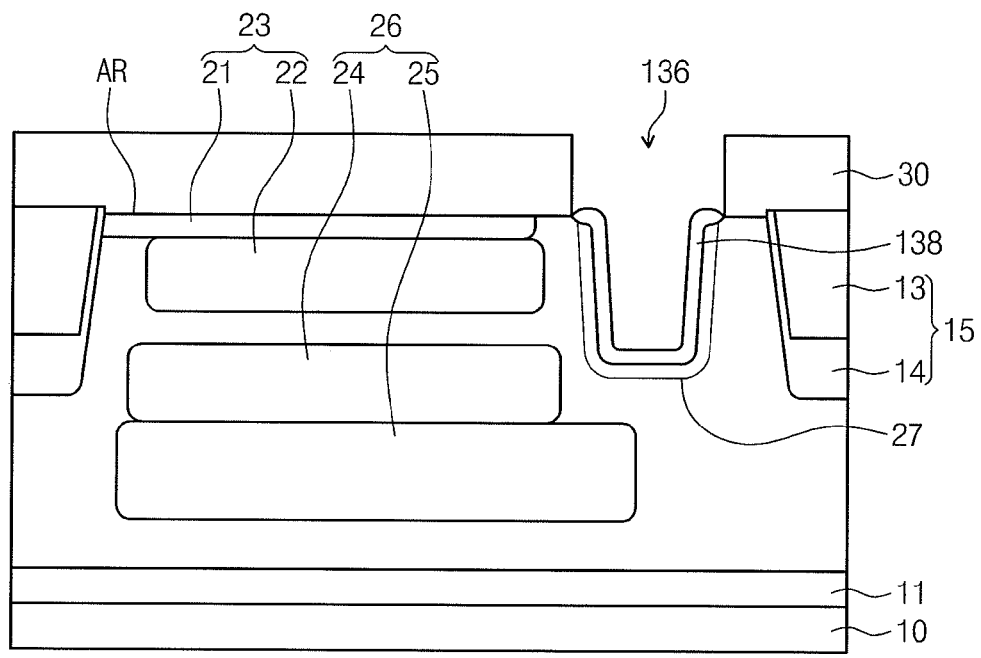
Figure 15B:
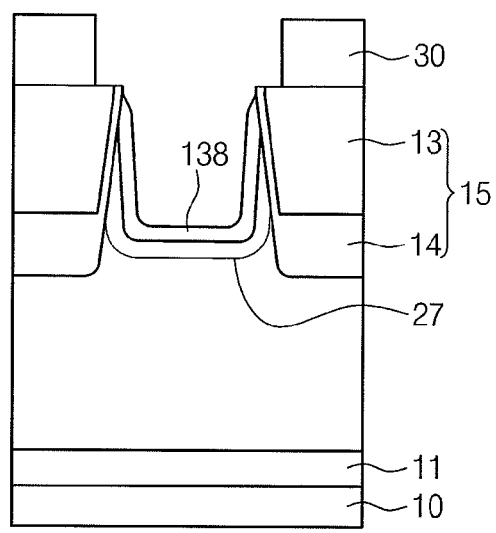
Figure 16A:
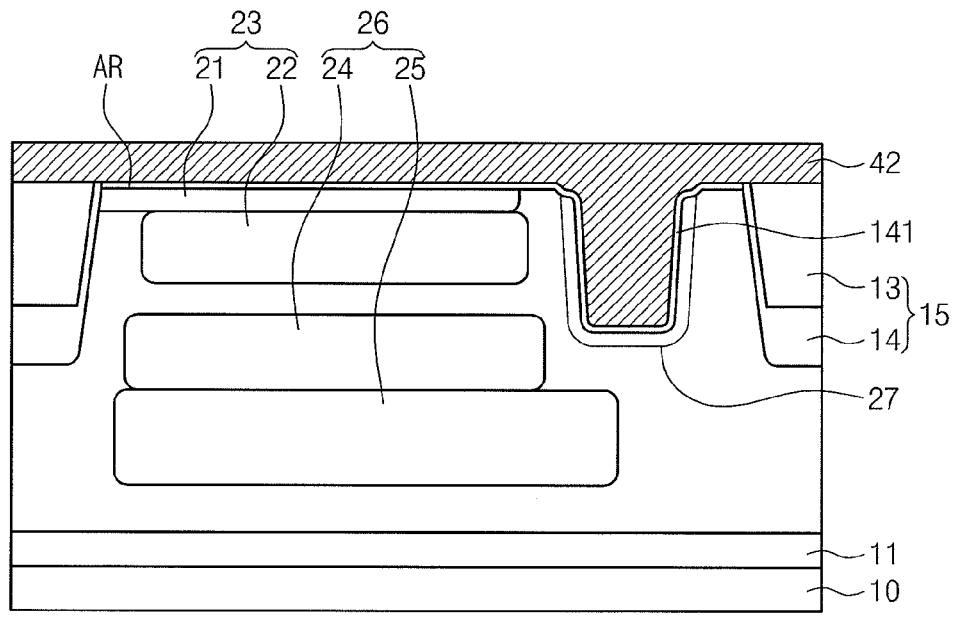
Figure 16B:
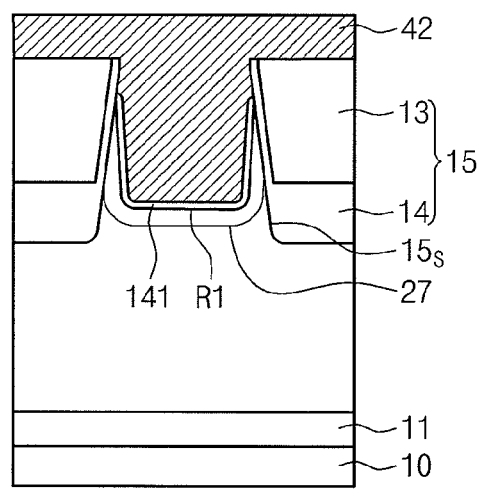

A method of forming the exemplary image sensor illustrated in FIGS. 12-13B will be explained. FIGS. 14A, 15A, 16A illustrate cross sectional views of resulting structures from stages in the exemplary method of forming the exemplary structure corresponding to FIG. 13A, taken along the dotted line C-C' of FIG. 12. FIGS. 14B, 15B, and 16B illustrate cross sectional views of resulting structures from stages in the exemplary method of forming the exemplary structure corresponding to FIG. 13B, as taken along the dotted line D-D' of FIG. 12. In general, only differences between the exemplary embodiment of FIGS. 12-13B and the exemplary embodiment of FIGS. 2-3B will be described. Detailed explanation with respect to overlapping technical features, as explained referring to FIGS. 6A through 11B will be omitted.

Referring to FIGS. 14A and 14B, a sidewall of the sacrificial spacer 34 may be substantially aligned with an edge of the device isolation region 15 or may be formed to expose a portion of the edge of the device isolation region 15. Using the sacrificial spacers 34 and the mask pattern 30 as etch masks, a trench 136 may be formed by etching the semiconductor substrate 10. A width W13 of the trench 136 may be narrower than a width W12 of the opening 35 defined by the sacrificial spacer 34. A sidewall of the trench 136 may be slanted. Referring to FIG. 14B, an upper portion of the sidewall of the trench 136 and the upper portion of the sidewall of the device isolation region 14 may meet together and form an acute angle AA.

Referring to FIGS. 15A and 15B, the sacrificial spacer 34 may be selectively removed. By performing a thermal oxidation process, a thermal oxide layer 138 may be formed on the sidewall and bottom of the trench 136. Bottom edge regions, e.g., bottom corners, of the trench 136 may be rounded. The upper portion of the semiconductor substrate 10 adjoining the device isolation region 15 may be completely oxidized and may correspond to a portion of the thermal oxide layer 138. The thermal oxide layer 138 may be formed to be in contact with the upper portion of the sidewall 15s of the device isolation region 15.

Referring to FIGS. 16A and 16B, the mask pattern 30 may be removed. The thermal oxide layer 138 may be removed by a wet etching process. As a result, the recessed portion R1 having a rounded bottom edge may be formed. The upper portion of the sidewall 15s of the device isolation region 15 may be exposed. By performing a thermal oxidation process, a gate dielectric layer 141 may be formed on the semiconductor substrate 10. The gate layer 42 may be formed by filling the recessed portion R1. The gate layer 42 may be formed to be in contact with the upper portion of the sidewall 15s of the device isolation region 15.

Referring again to FIGS. 13A and 13B, the capping layer pattern 44 overlapping the recessed portion R1 may be formed on the gate layer 42. Using the capping layer pattern 44 as an etching mask, a transfer gate TG1 may be formed by etching the gate layer 42. At this point, the gate dielectric layer 141 may also be removed. The spacer 46 covering the sidewall of the transfer gate TG1 may be formed. By using an n-type impurity ion implantation process using the spacer 46 and a mask covering the photoelectric conversion region PD, the floating diffusion region FD may be formed on another side of the transfer gate TG1 opposing the photoelectric conversion region PD.

Figure 17:
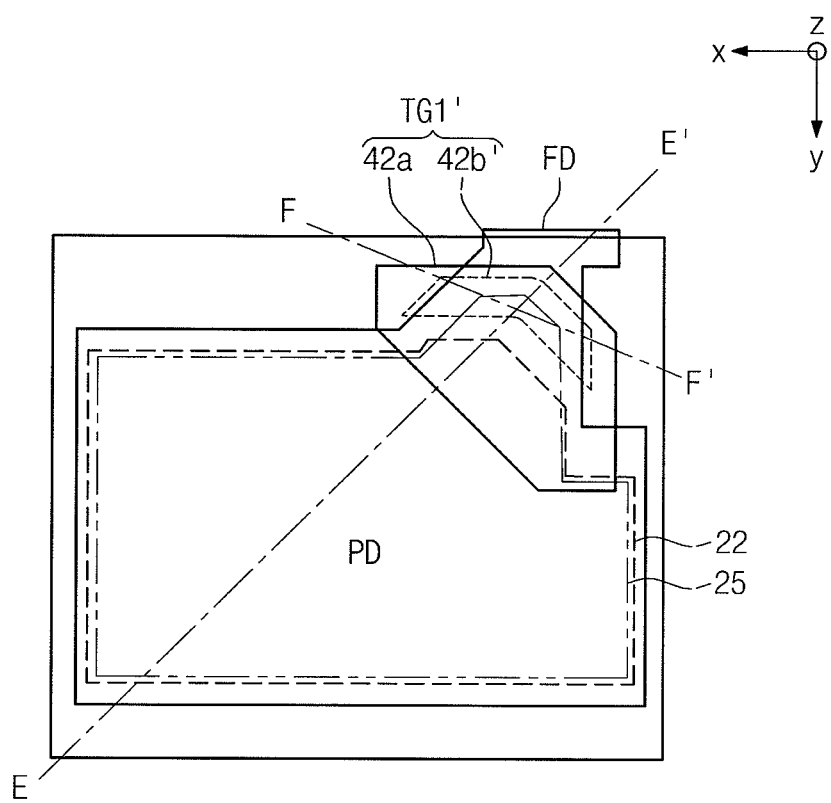
FIG. 17 illustrates a layout diagram of another exemplary embodiment of a pixel employable by the image sensor of FIG. 1.
Figure 18A:
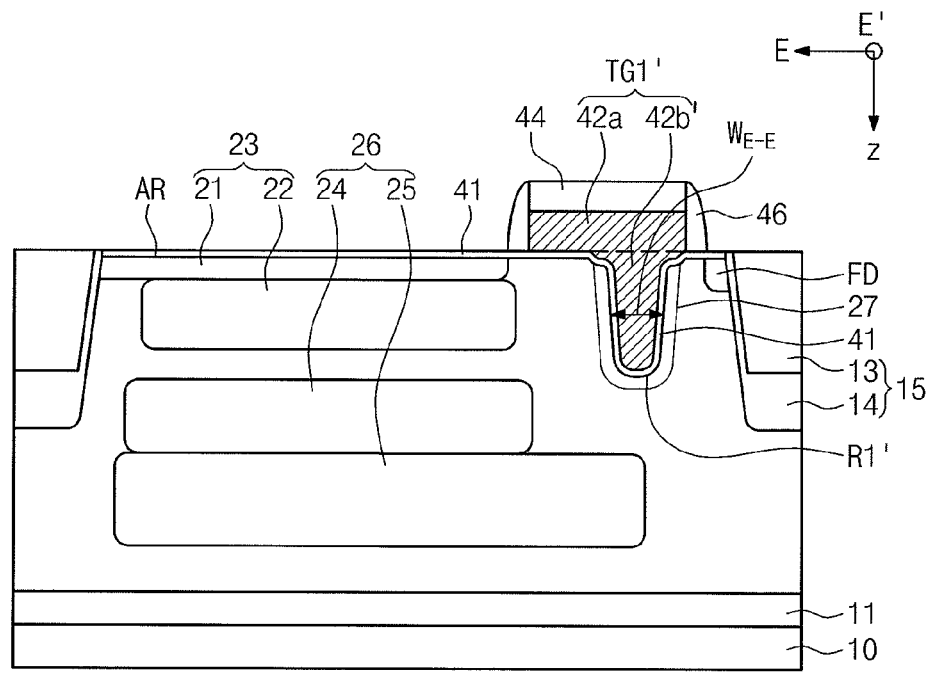
FIG. 18A illustrates a cross-sectional view of the pixel of FIG. 17, taken along the dotted line E-E' of FIG. 17.
Figure 18B:
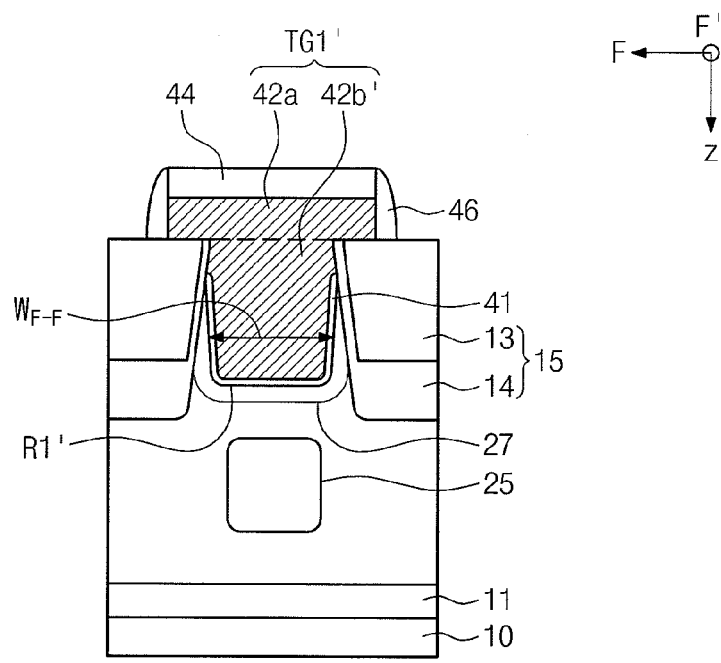
FIG. 18B illustrates a cross-sectional view of the pixel of FIG. 17, taken along the dotted line F-F' of FIG. 17.

An image sensor according to another exemplary embodiment will be explained. FIG. 17 illustrates a layout diagram of another exemplary embodiment of a pixel employable by the image sensor of FIG. 1. FIG. 18A illustrates a cross-sectional view of the pixel of FIG. 17, taken along the dotted line E-E' of FIG. 17. FIG. 18B illustrates a cross-sectional view of the pixel of FIG. 17, taken along the dotted line F-F' of FIG. 17. In general, only differences between the exemplary embodiment of FIGS. 18A and 18B and the exemplary embodiment of FIGS. 13A and 13B will be described. Detailed explanation with respect to overlapping technical features, as explained referring to FIGS. 3A through and 3B will be omitted.

Referring to FIGS. 17, 18A and 18B, side surfaces of a recessed region R1' of the transfer gate TG1' facing each other in the E-E' direction may be separated from the device isolation region 15, as shown in FIG. 18A. An upper portion of another sidewall of the recessed region R1' facing each other in the F-F' direction may contact the device isolation region 15 and the bottom portion thereof may be separated from the device isolation region 15, as shown in FIG. 18B. A width $W_{E-E}$ between side surfaces of a second sub-gate 42b' facing each other in the E-E' direction may be narrower than a width $W_{F-F}$ between side surfaces of the second sub-gate 42b' facing each other in the F-F' direction. The width WE-E of the exemplary embodiment of FIG. 18A may also be narrower than a width between side surface of the second sub-gate 42b facing each other in the A-A' direction of FIGS. 2-3B. Referring to FIG. 17, a plan-view shape of the second sub-gate 42b' may look like a boomerang. An exemplary manufacturing method of an image sensor according to this embodiment may be the same or similar to the exemplary embodiments described above.

Figure 19A:
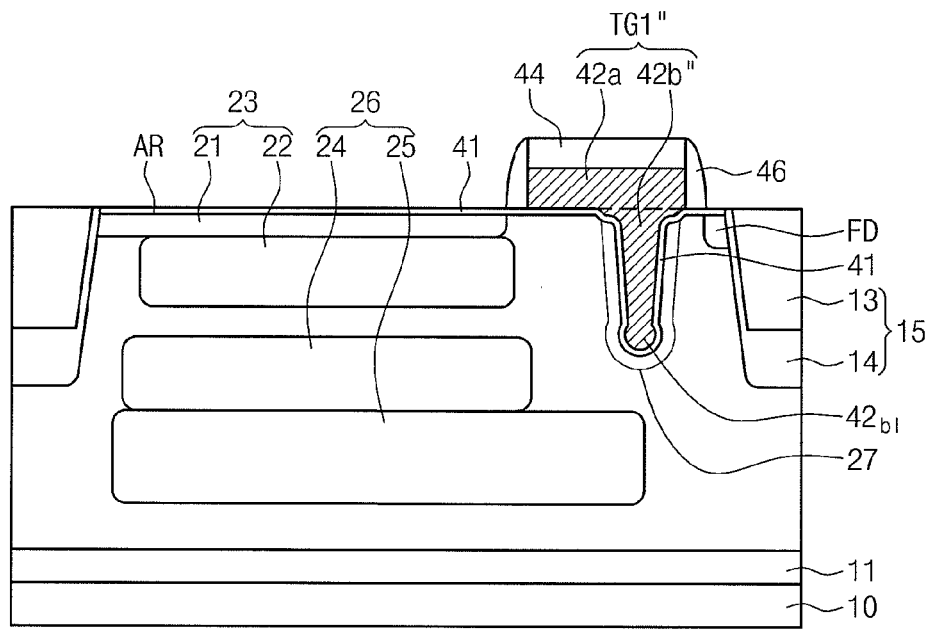
FIG. 19A illustrates a cross-sectional view of another exemplary embodiment of the pixel of FIG. 17, taken along the dotted line E-E' of FIG. 17.
Figure 19B:
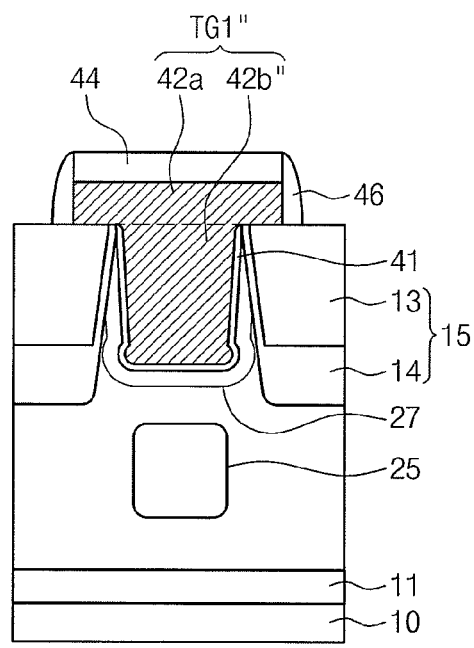
FIG. 19B illustrates a cross-sectional view of the another exemplary embodiment of the pixel of FIG. 17, taken along the dotted line F-F' of FIG. 17.

An exemplary alternative to image sensor described above with regard to FIGS. 18A and 18B will be explained. FIG. 19A represents a cross-sectional view taken along the dotted line E-E' of FIG. 17 and FIG. 19B represent a cross-sectional view taken along the dotted line F-F' of FIG. 17. In general, only differences between the exemplary embodiment of FIGS. 19A and 19B and the exemplary embodiment of FIGS. 18A and 18B will be described. Detailed explanation with respect to overlapping technical features, as explained above will be omitted.

Figure 20A:
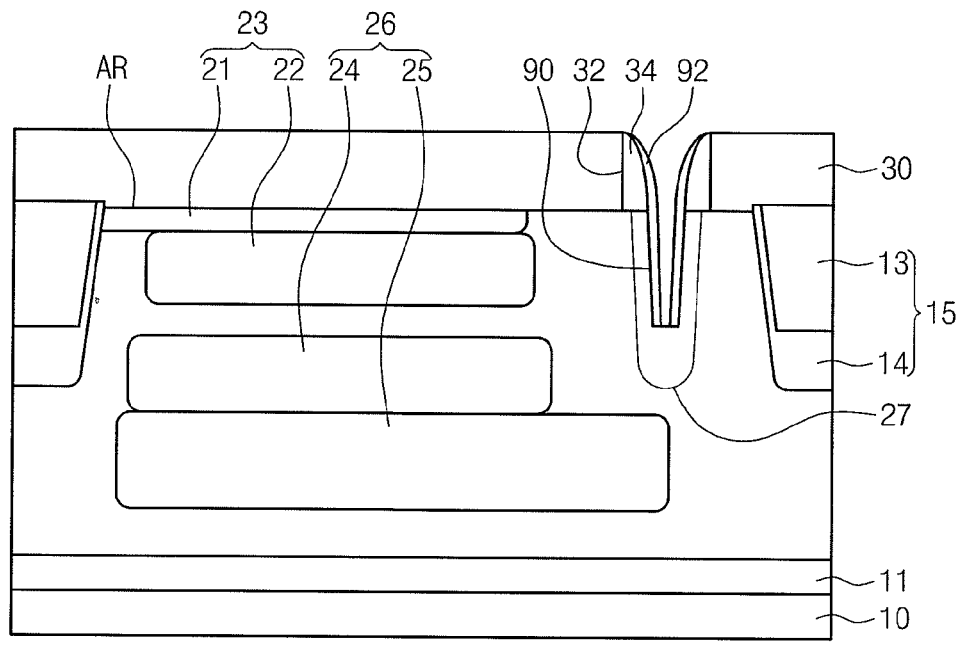
FIGS. 20A and 21A illustrate cross-sectional views of resulting structures resulting from stages in an exemplary method of forming the exemplary structure corresponding to FIG. 19A, taken along the dotted line E-E' of FIG. 17.
Figure 20B:
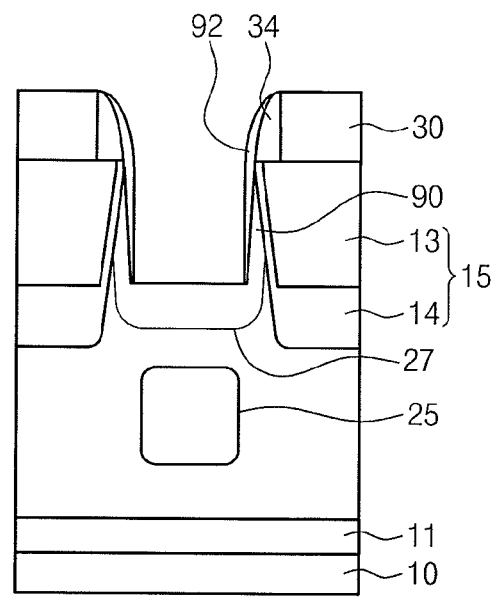
FIGS. 20B and 21B illustrate cross-sectional views of resulting structures resulting from stages in an exemplary method of forming the exemplary structure corresponding to FIG. 19B, taken along the dotted line F-F' of FIG. 17.
Figure 21A:
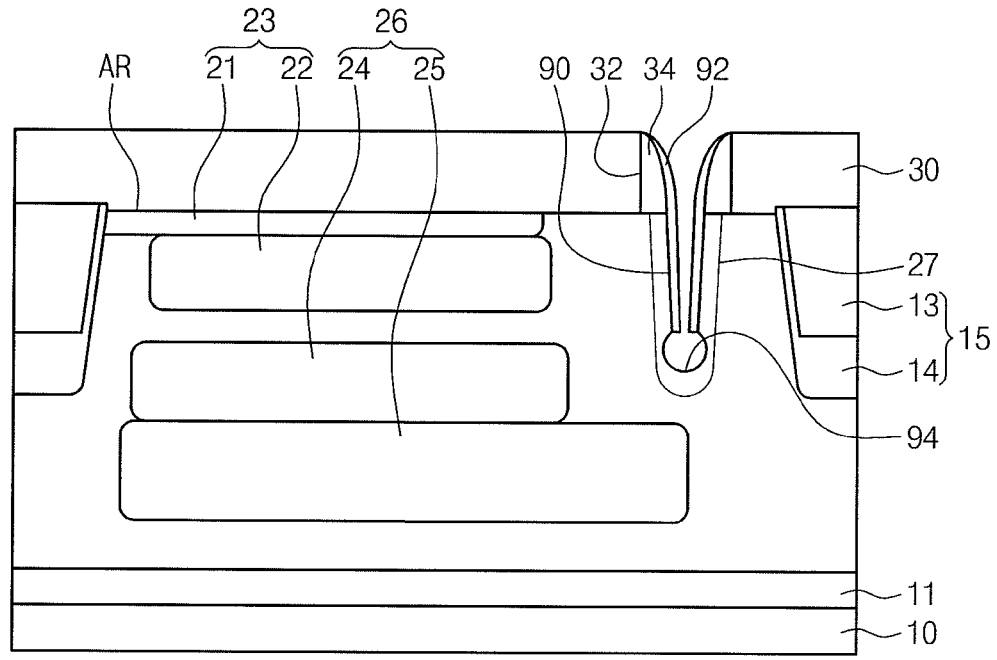
Figure 21B:
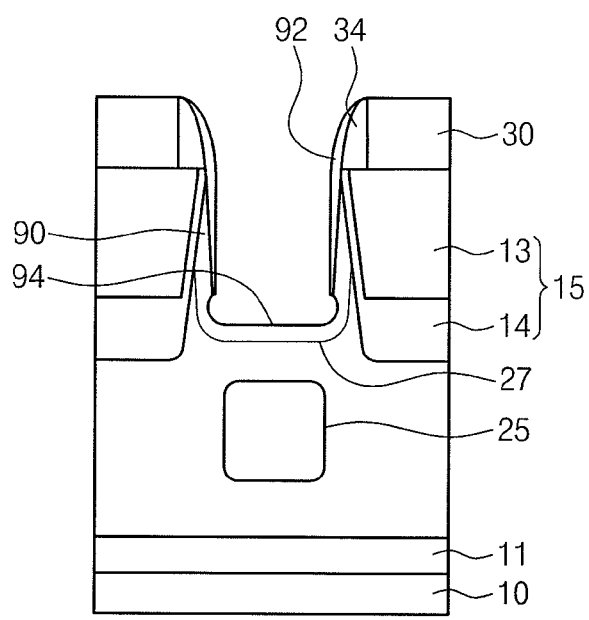

Referring to FIGS. 19A and 19B, a lower portion 42b1 of a second sub-gate 42b'' may be rounded. An exemplary forming method of the second sub-gate 42b'' having a rounded profile at the lower portion 42b1 will be explained referring to FIGS. 20A, 20B, 21A, and 21B. FIGS. 20A and 21A illustrate cross-sectional views of resulting structures resulting from stages in an exemplary method of forming the exemplary structure corresponding to FIG. 19A, taken along the dotted line E-E' of FIG. 17. FIGS. 20B and 21B illustrate cross-sectional views of resulting structures resulting from stages in an exemplary method of forming the exemplary structure corresponding to FIG. 19B, taken along the dotted line F-F' of FIG. 17;

Referring to FIGS. 20A and 20B, a trench 90 may be formed by using the sacrificial spacer 34 covering a sidewall of the hard mask pattern 30, according to a method explained referring to FIGS. 8A and 8B. Then, an inner wall spacer 92 may be formed to cover the sidewall of the sacrificial spacer 34 and a sidewall of the trench 90. The inner wall spacer 92 may expose a bottom of the trench 90.

Referring to FIGS. 21A and 21B, using the inner wall spacer 92 and the hard mask pattern 30 as etching masks, the exposed bottom of the trench 90 may be isotropically etched. Accordingly, a further recessed portion 94 may be formed at bottom of the trench 90.

The inner wall spacer 92 and the sacrificial spacer 34 may be removed. Thereafter, according to a method similar to the first embodiment, a gate dielectric layer 41, a transfer gate TG1" and a floating diffusion region FD may be formed like FIGS. 19A and 19B.

Figure 22:
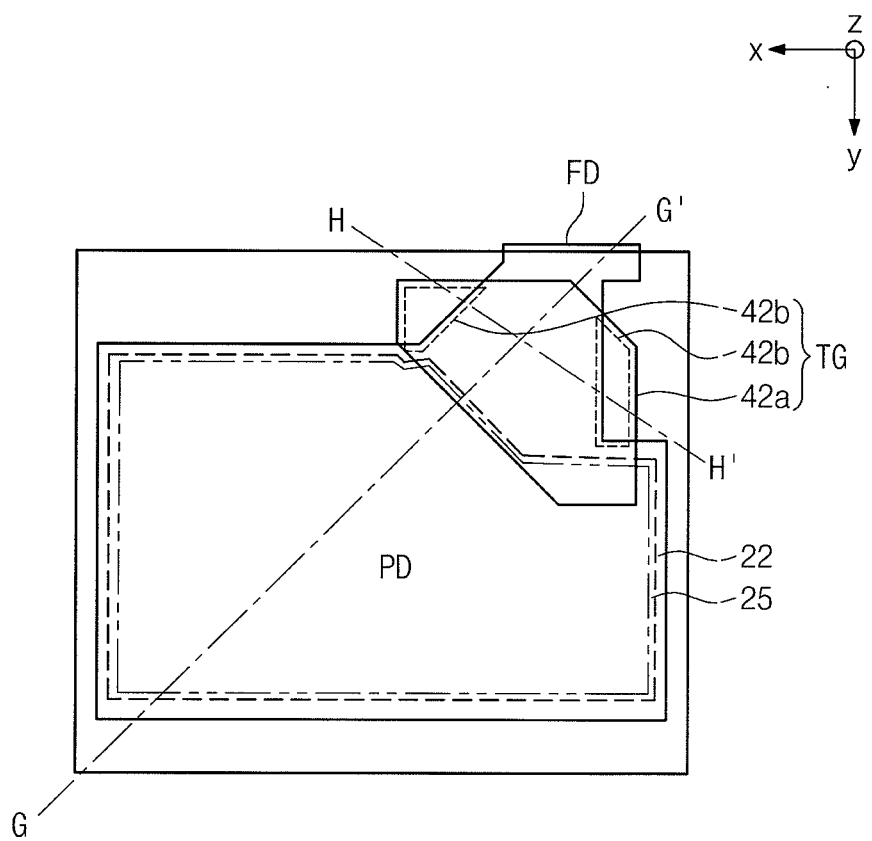
FIG. 22 illustrates a layout diagram of another exemplary embodiment of a pixel employable by the image sensor of FIG. 1.
Figure 23A:
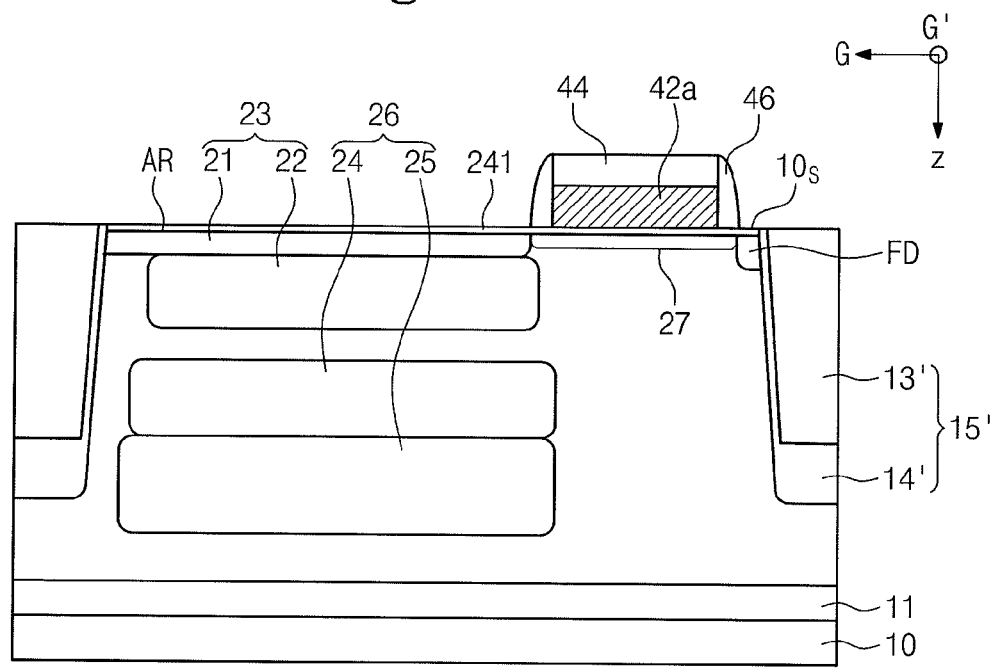
FIG. 23A illustrates a cross-sectional view of the pixel of FIG. 22, taken along the dotted line G-G' of FIG. 22.

An image sensor according to another exemplary embodiment will be explained. FIG. 22 illustrates a layout diagram of another exemplary embodiment of a pixel employable by the image sensor of FIG. 1. FIG. 23A illustrates a cross-sectional view of the pixel of FIG. 22, taken along the dotted line G-G' of FIG. 22.

Figure 23B:
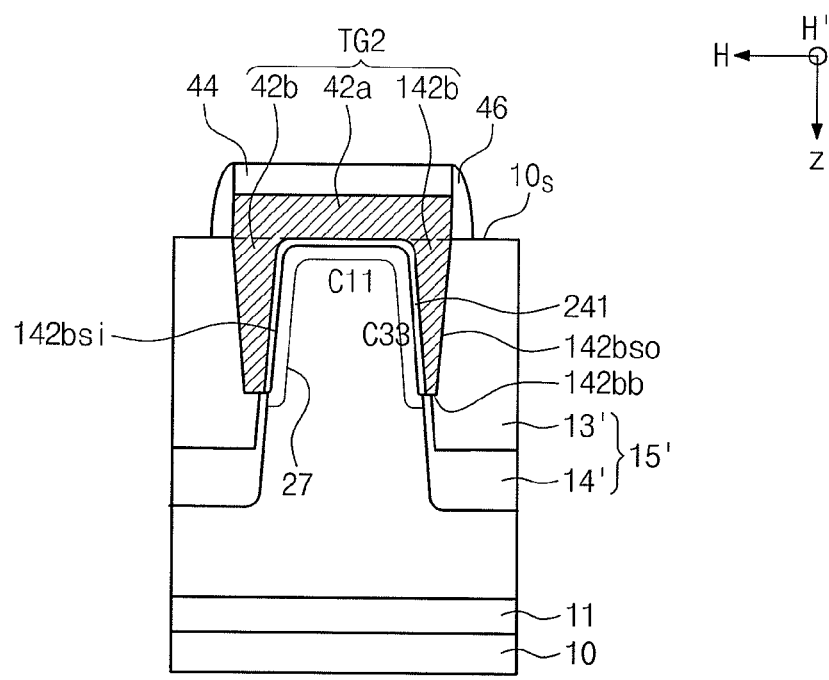
FIG. 23B illustrates a cross-sectional view of the pixel of FIG. 22, taken along the dotted line H-H' of FIG. 22.

FIG. 23B illustrates a cross-sectional view of the pixel of FIG. 22, taken along the dotted line H-H' of FIG. 22. In general, only differences between the exemplary embodiment of FIGS. 23A and 123B and the exemplary embodiment of FIGS. 3A and 3B will be described. Detailed explanation with respect to overlapping technical features, as explained above will be omitted.

Referring to FIGS. 22, 23A and 23B, a transfer gate TG2 may include the first sub-gate 42a provided on the upper surface 10s of the semiconductor substrate and a second sub-gate 142b provided below the surface 10s of the semiconductor substrate 10. The first sub-gate 42a may protrude above the semiconductor substrate 10. The second sub-gate 142b may protrude into a device isolation region 15'. A sidewall 142bso and a bottom region 142bb of the second sub-gate 142b may contact the device isolation region 15'. Another sidewall 142bsi of the second sub-gate 142b may face the semiconductor substrate 10, with a gate dielectric layer 241 interposed therebetween. More particularly, e.g., the second sub-gate 142b may extend below an end portion, e.g., both end portions, of the first sub-gate 42a. The transfer gate TG2 may have a π shape. The transfer gate TG2 may be formed to cover a portion of the semiconductor substrate 10 located at one side of the photoelectric conversion region PD. Charges generated in the first photoelectric conversion element 23 may transport through a surface channel C11 formed at the surface of the semiconductor substrate 10 under the first sub-gate 42a. The charges generated in the second photoelectric conversion element 26 may transport through a side channel C33 at a portion of the semiconductor substrate 10 adjoining the sidewalls 142bsi of the second sub-gate 142b.

An exemplary method of forming an image sensor according to this example embodiment will be explained. FIGS. 24A through 25A illustrate cross-sectional views of resulting structures resulting from stages in an exemplary method of forming the exemplary structure corresponding to FIG. 23A, taken along the dotted line G-G' of FIG. 22. FIGS. 24B through 25B illustrate cross-sectional views of resulting structures resulting from stages in an exemplary method of forming the exemplary structure corresponding to FIG. 23B, taken along the dotted line H-H' of FIG. 22. In general, only differences between the exemplary embodiment of FIGS. 24A-25B and the exemplary embodiment of FIGS. 6A-11B will be described. Detailed explanation with respect to overlapping technical features, as explained referring to FIGS. 6A through 11B will be omitted.

Figure 24A:
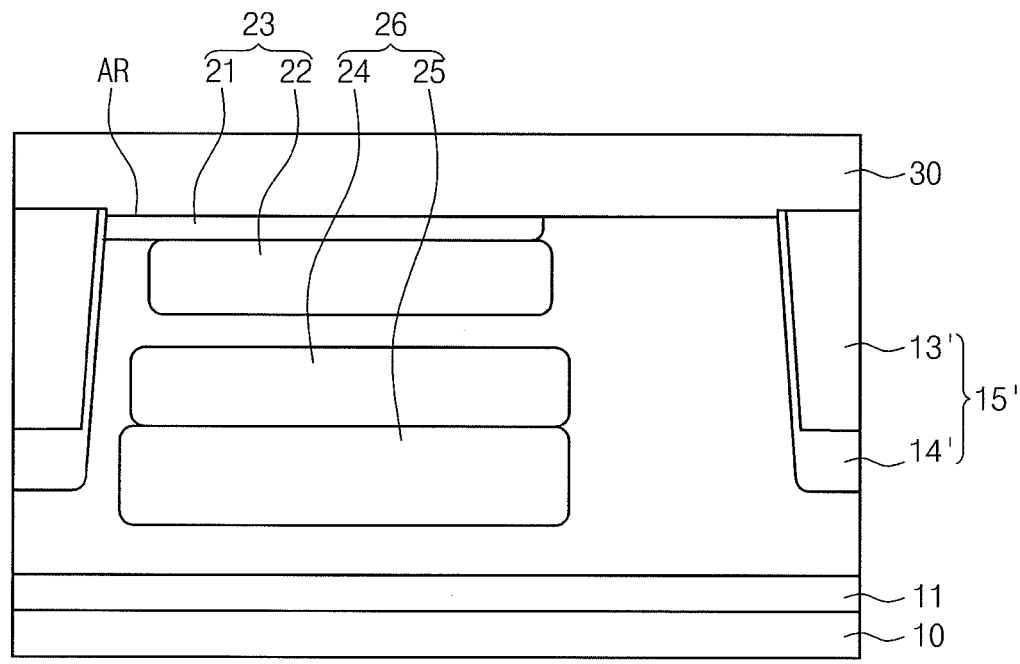
Figure 24B:
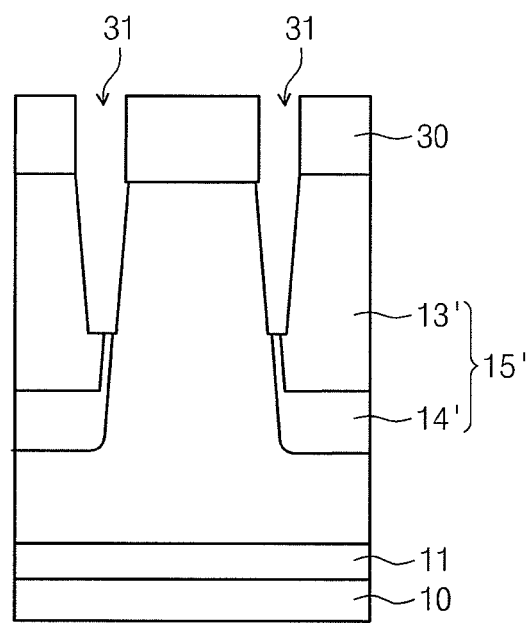

Referring to FIGS. 24A and 24B, the deep well 11, the device isolation layer 15', the plurality of photoelectric conversion elements 23, 26 and a device isolation impurity region 14' may be formed on the semiconductor substrate 10. A device isolation layer 13' may also be formed. The hard mask pattern 30 may be formed on the semiconductor substrate 10. The hard mask pattern 30 may be formed to have an opening, which partially exposes the device isolation layer 15' adjoining a portion of the semiconductor substrate 10 where the transfer gate will be formed later on. By etching the device isolation region 15' using the hard mask pattern 30 as an etching mask, a trench 31 exposing the side surface of the semiconductor substrate 10, which comes into contact with the device isolation region 15', may be formed.

Figure 25A:
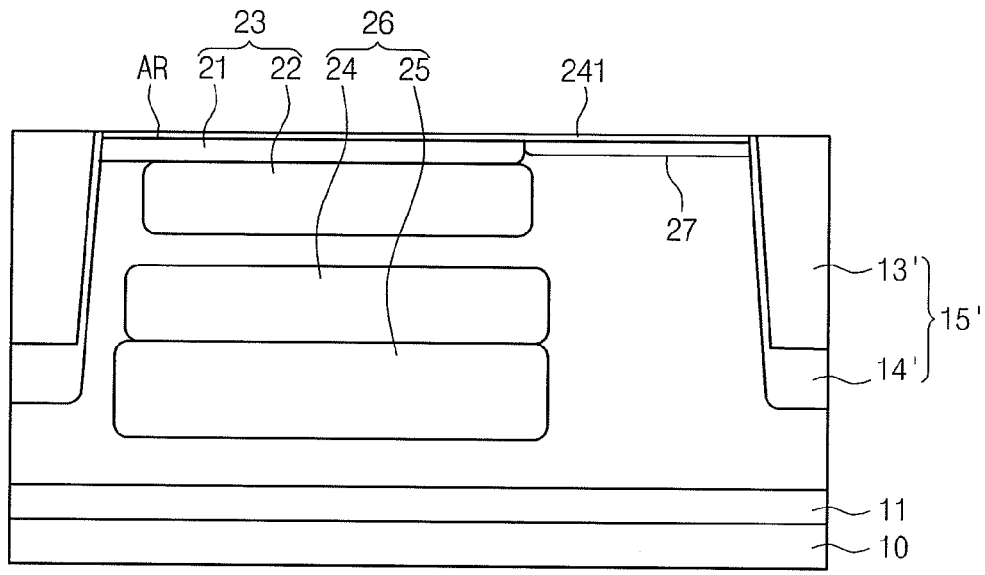
Figure 25B:
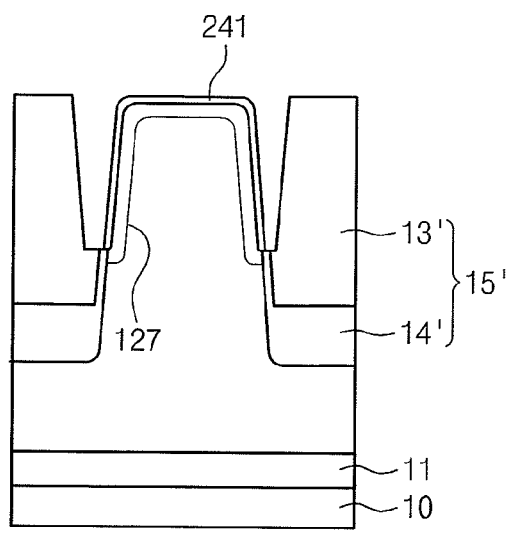

Referring to FIGS. 25A and 25B, the hard mask pattern 30 may be removed. By performing an oblique ion-implantation process using a mask exposing an area where the transfer gate to be formed, a channel impurity region 127 may be formed. Thereafter, according to a method similar to the first embodiment, a gate dielectric layer 241, the transfer gate TG2 and the floating diffusion region FD may be formed, as illustrated in FIGS. 23A and 23B.

In the above-description of exemplary embodiments, while the second photoelectric conversion element 26 was described and/or illustrated in the corresponding figures as extending below the recessed portion R, embodiments of the present inventive concept are not limited as such, and may be modified in many different forms.

Figure 26:
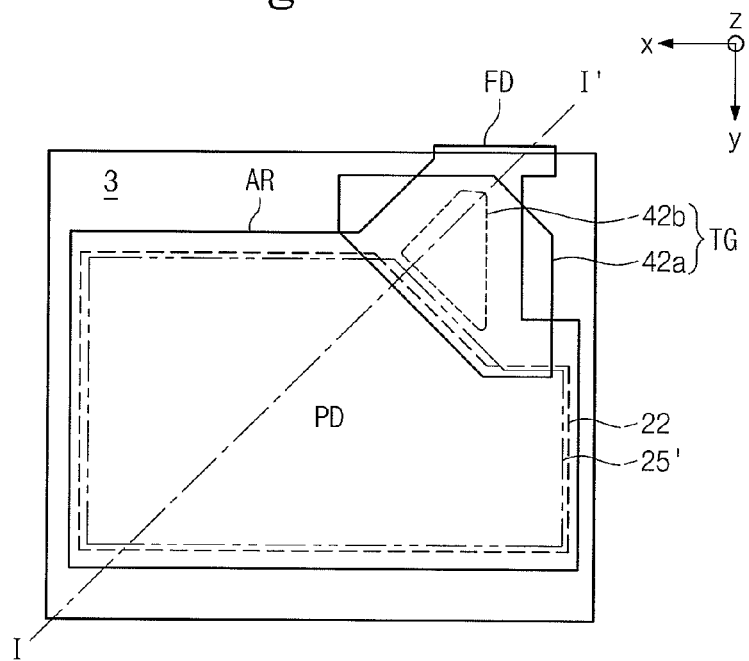
FIG. 26 illustrates a layout diagram of another exemplary embodiment of a pixel employable by the image sensor of FIG. 1.
Figure 27:
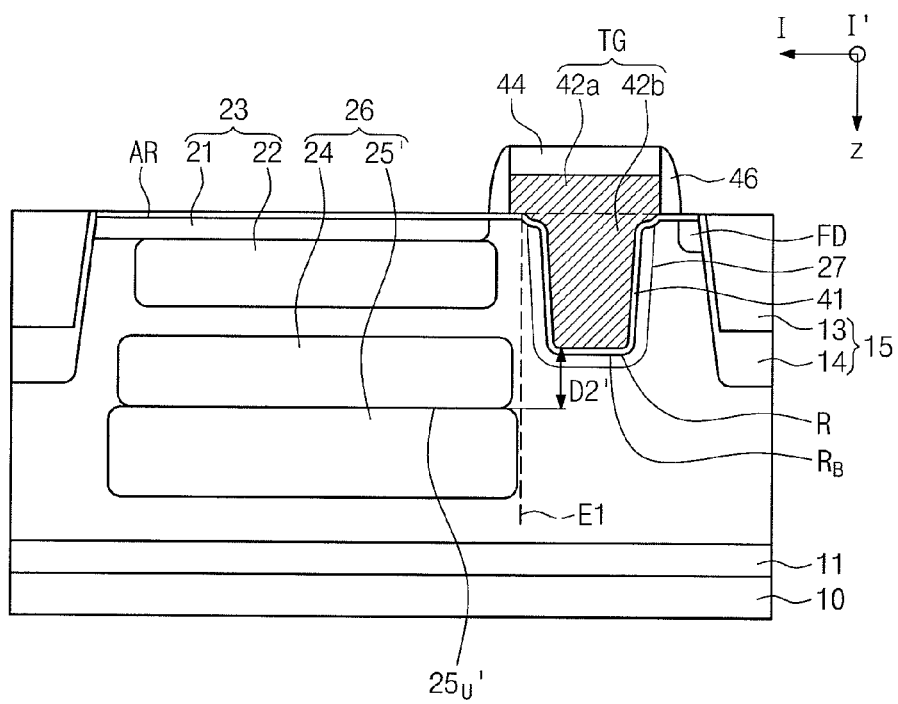
FIG. 27 illustrates a cross-sectional view of the pixel of FIG. 26, taken along the dotted line I-I' of FIG. 26.

FIG. 26 illustrates a layout diagram of another exemplary embodiment of a pixel employable by the image sensor of FIG. 1. FIG. 27 illustrates a cross-sectional view of the exemplary pixel of FIG. 26, taken along the dotted line I-I' of FIG. 26.

Referring to FIGS. 26 and 27, a second n-type impurity region 25' may not vertically overlap, along the z-direction, the second sub-gate 42b. In other words, an edge E1 of a sidewall of the second sub-gate 42b adjoining the second sub-gate 42b may not vertically overlap the second n-type impurity region 25'. An upper surface 25u' of the second n-type impurity region 25 and the bottom surface $R_B$ of the recessed portion R may be separated from each other by a second distance D2'. In such embodiments, the second distance D2' may be greater than the second distance D2 of the exemplary embodiment illustrated in FIG. 3A.

Figure 28:
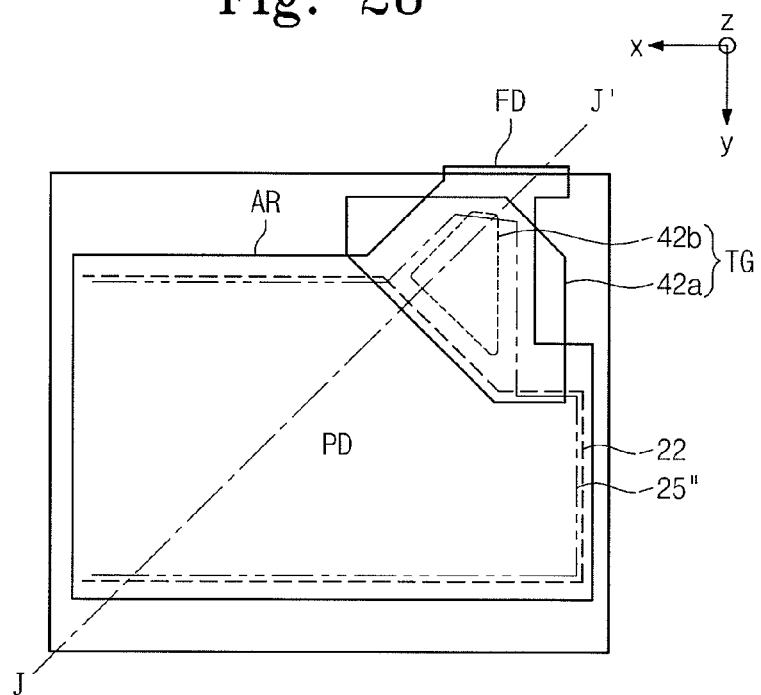
FIG. 28 illustrates a layout diagram of another exemplary embodiment of a pixel employable by the image sensor of FIG. 1.
Figure 29:
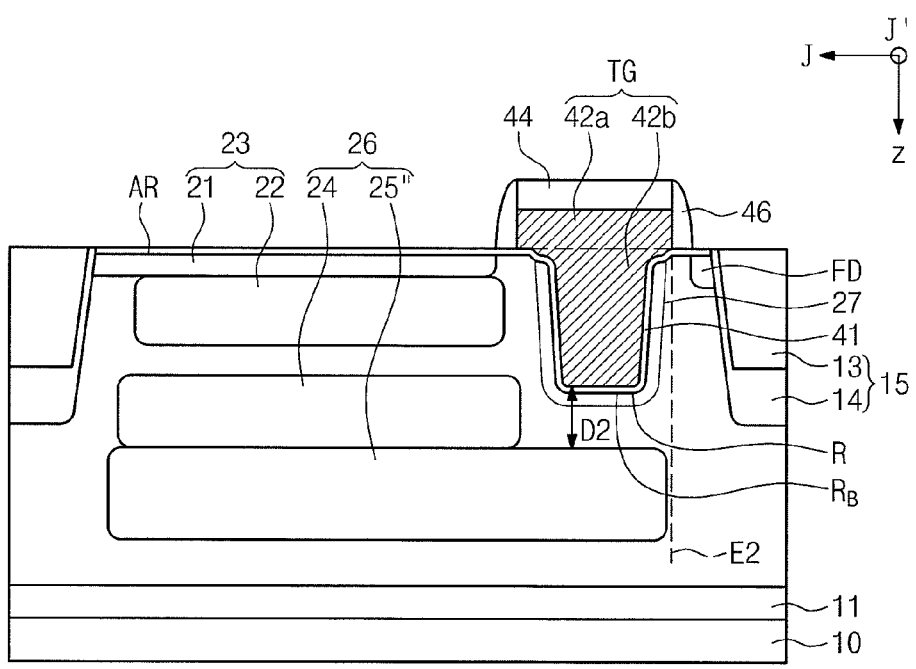
FIG. 29 illustrates a cross-sectional view of the pixel of FIG. 28, taken along the dotted line J-J' of FIG. 28.

FIG. 28 illustrates a layout diagram of another exemplary embodiment of a pixel employable by the image sensor of FIG. 1. FIG. 29 illustrates a cross-sectional view of the exemplary pixel of FIG. 28, taken along the dotted line J-J' of FIG. 28.

Referring to FIGS. 28 and 29, a second n-type impurity region 25" may further extend below the transfer gate TG as compared, e.g., to the exemplary embodiment of FIG. 3A. In the exemplary embodiment of FIGS. 28 and 29, the second n-type impurity region 25" extends to an edge E2 of another sidewall of the second n-type impurity region 25.

Although the second sub-gate 42b of the transfer gate TG is described and/or illustrated as having a trapezoidal shape in the above description of exemplary embodiments, embodiments of the present inventive concept are not so limited and may be modified in many different forms.

Figure 30:
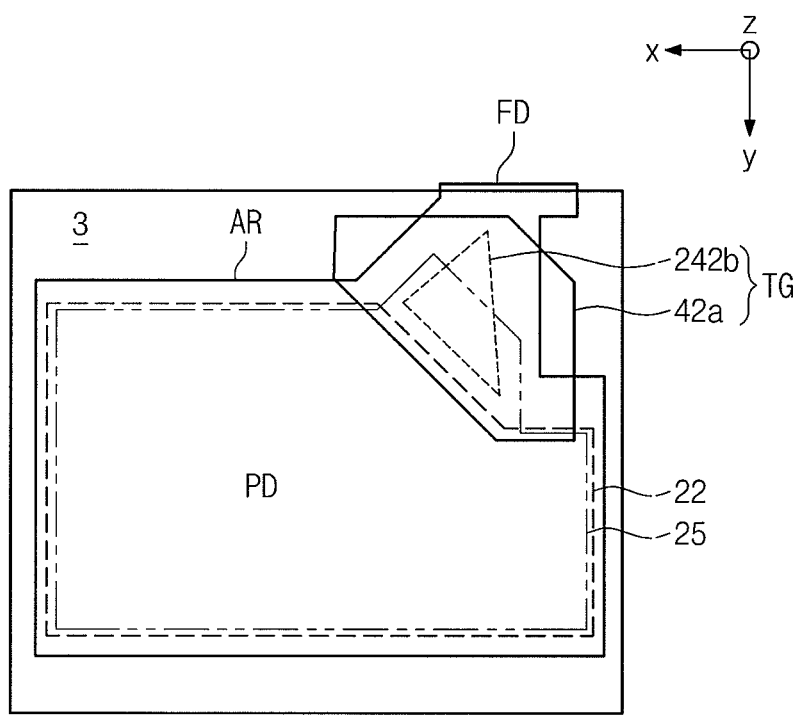
FIG. 30 illustrates a layout diagram of another exemplary embodiment of a pixel employable by the image sensor of FIG. 1.

FIG. 30 illustrates a layout diagram of another exemplary embodiment of a pixel employable by the image sensor of FIG. 1. Referring to FIG. 30, the second sub-gate 242b may have a plain shape of triangle.

Embodiments of image sensors employing one or more features of the exemplary embodiments may further include a color filter provided on the semiconductor substrate 10. More particularly, a color filter may be provided in each of the exemplary embodiments described in relation to FIGS. 1-30. By employing a color filter, a light of a single respective wavelength may be incident upon the photoelectric conversion elements, e.g., 23, 26.

Figure 31:
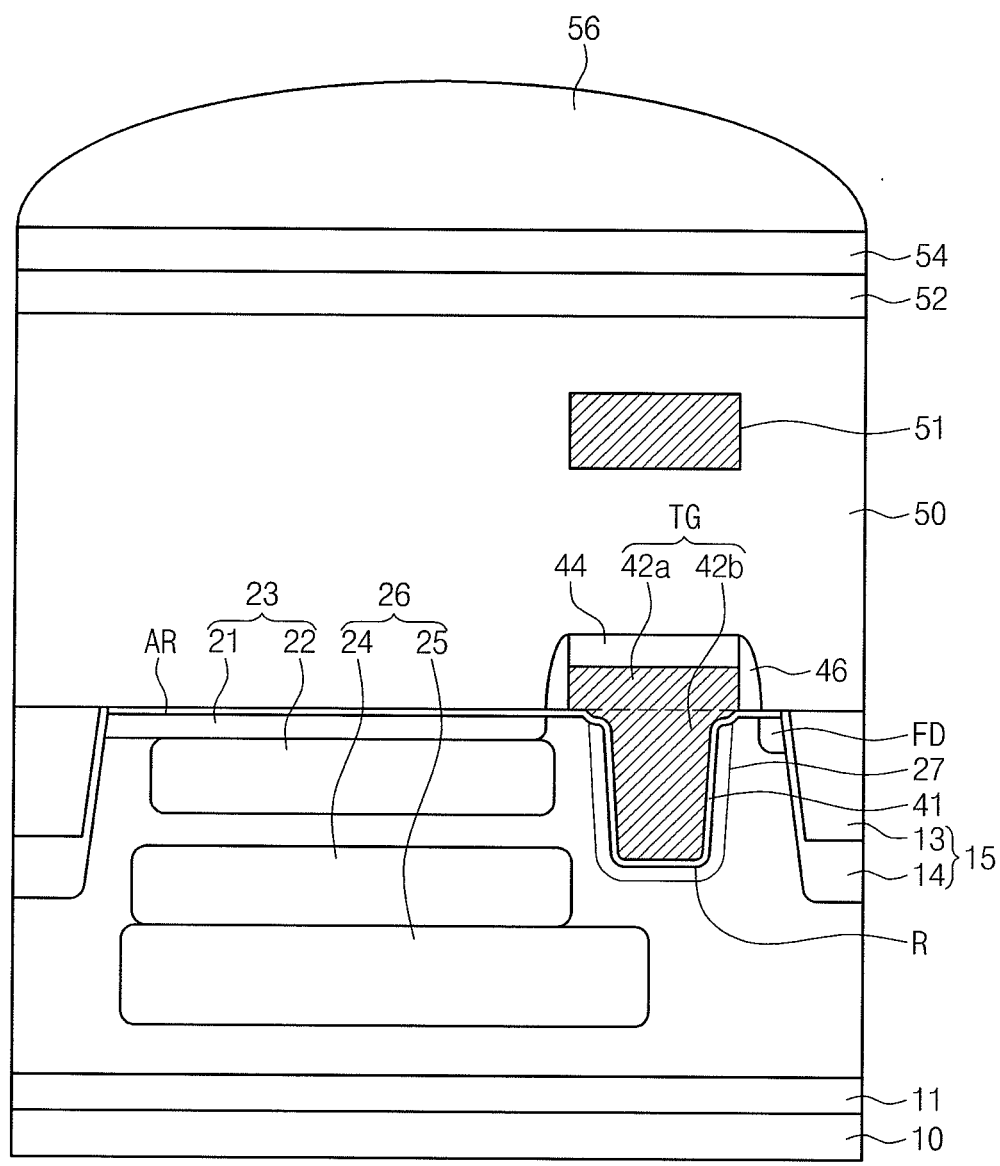
FIG. 31 illustrates a cross-sectional diagram of another exemplary embodiment of a pixel employable by the image sensor of FIG. 1.

FIG. 31 illustrates a cross-sectional diagram of another exemplary embodiment of a pixel employable by the image sensor of FIG. 1. Referring to FIG. 31, an interlayer dielectric 50 covering a semiconductor substrate 10 may be provided. An interconnection layer 51 may be provided in the interlayer dielectric 50. The interconnection layer 51 may be respectively connected to the gates. The interlayer dielectric 50 may include a plurality of dielectric layers. A planarization layer 52 and a color filter 54 may be sequentially stacked on the interlayer dielectric 50. A micro lens 56 may be provided on the color filter 54. The color filter 54 may be, for example, one of the three primary colors, i.e., red, green, and blue.

Figure 32:
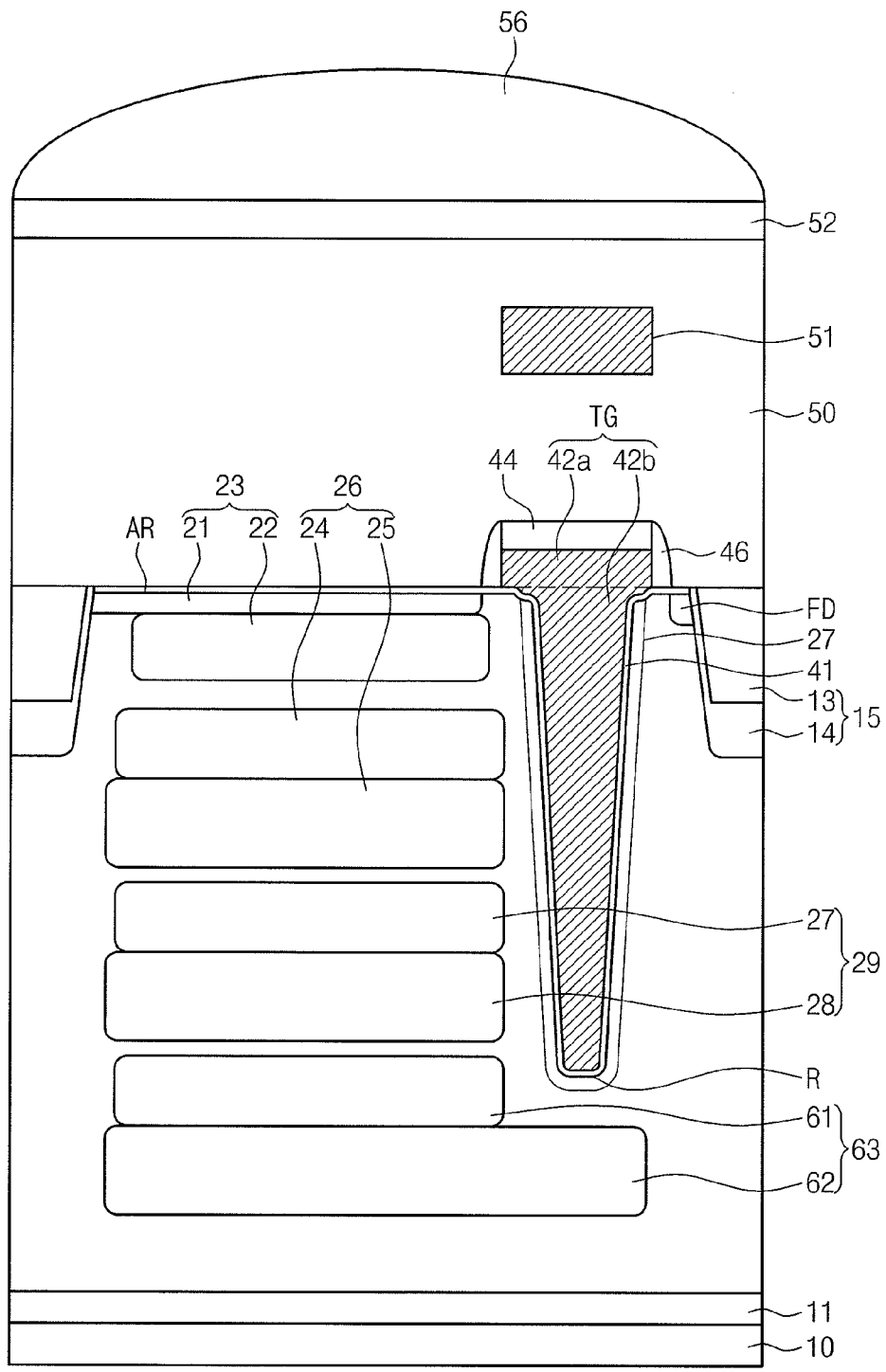
FIG. 32 illustrates a cross-sectional diagram of another exemplary embodiment of a pixel employable by the image sensor of FIG. 1.

FIG. 32 illustrates a cross-sectional diagram of another exemplary embodiment of a pixel employable by the image sensor of FIG. 1. Referring to FIG. 32, the image sensor may include the interlayer dielectric 50 covering a semiconductor substrate 10. The interconnection layer 51 may be formed within the interlayer dielectric 50. The interlayer dielectric 50 may include a plurality of dielectric layers. The planarization layer 52 may be sequentially stacked on the interlayer dielectric 50. The micro lens 56 may be disposed on the planarization layer 52. The interconnection layer 51 may be respectively connected to the gates. Because this example embodiment does not contain a color filter, light of each and every wavelength may be incident upon the photoelectric conversion region PD of the semiconductor substrate 10. For example, four photoelectric conversion elements 23, 26, 29, 63 vertically overlapping each other may be disposed in the semiconductor substrate 10. The four photoelectric conversion elements 23, 26, 29, 63 may include a first photoelectric conversion element 23, a second photoelectric conversion element 26, a third photoelectric conversion element 29, and a fourth photoelectric conversion element 63. The respective photoelectric conversion elements 23, 26, 29, 63 may include at least one respective n-type impurity-doped regions 22, 25, 28, 62. The respective photoelectric conversion elements 23, 26, 29, 63 may further include p-type impurity-doped regions 21, 24, 27, 61. Depths of respective photoelectric conversion elements 23, 26, 29, 63 may correspond to the penetration depths of specific wavelengths of the incident lights, i.e., the depths where the intensity of light of specific wavelengths are strongest in the semiconductor substrate. For example, the first photoelectric conversion element 23 may be disposed at a depth corresponding to the penetration depth of blue light, wavelength of which is relatively short. The second photoelectric conversion element 26 may be disposed at a depth corresponding to the penetration depth of green light. The third photoelectric conversion element 29 may be disposed at a depth corresponding to the penetration depth of red light. The fourth photoelectric conversion element 63 may be disposed at a depth corresponding to the penetration depth of infrared light. Accordingly, color separation according to penetration depth may be possible and an image sensor for three-dimensional image may be realized.

While the exemplary embodiment of FIG. 30 illustrates the color filter 54 being provided on the upper surface, i.e., the front side, of the semiconductor substrate 10 and light incident upon the upper surface of the semiconductor substrate 10. Embodiments of the present inventive concept, however, are not so limited.

Figure 33:
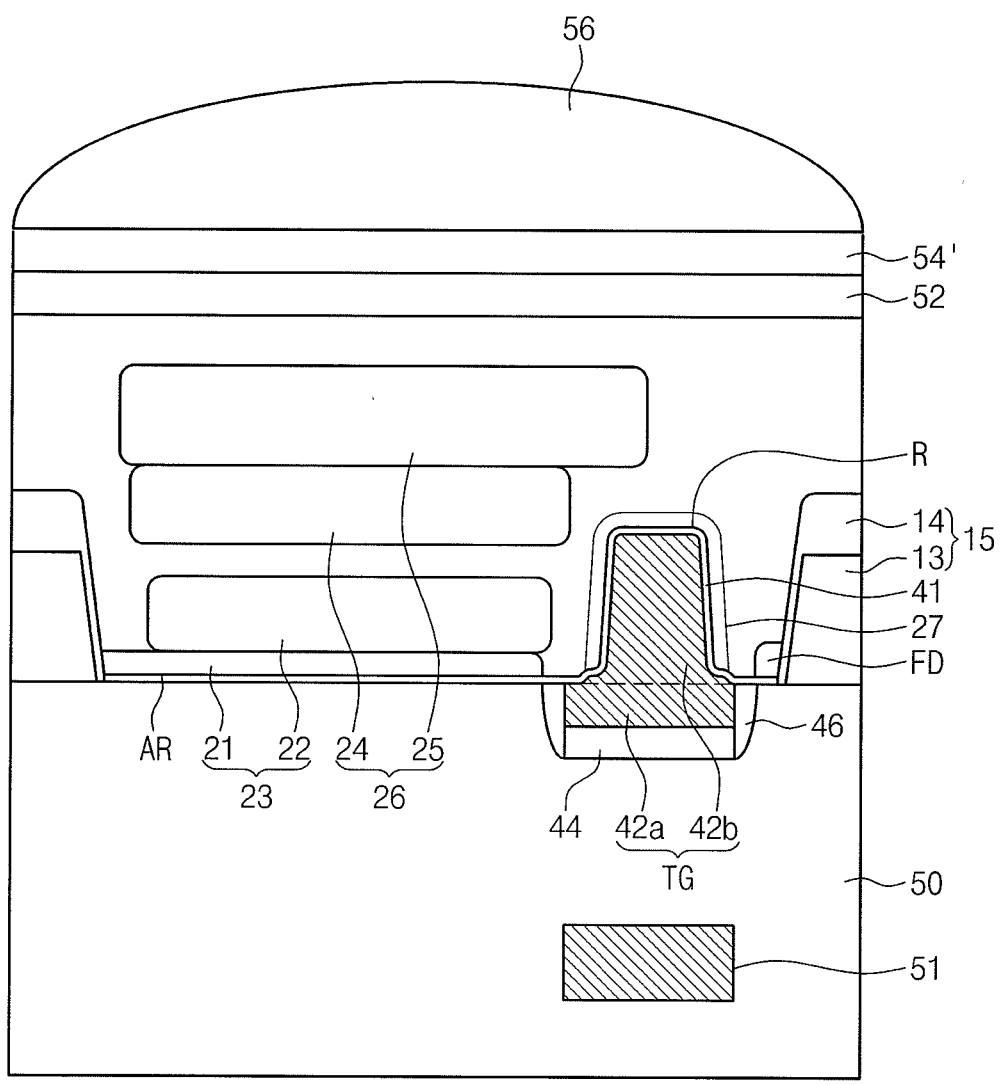
FIG. 33 illustrates a cross-sectional diagram of another exemplary embodiment of a pixel employable by the image sensor of FIG. 1.

FIG. 33 illustrates a cross-sectional diagram of another exemplary embodiment of a pixel employable by the image sensor of FIG. 1. Referring to FIG. 33, a color filter 54' is provided on the bottom surface, i.e., the back side, of the semiconductor substrate 10 and light may be incident upon the bottom surface of the semiconductor substrate 10.

Figure 34:
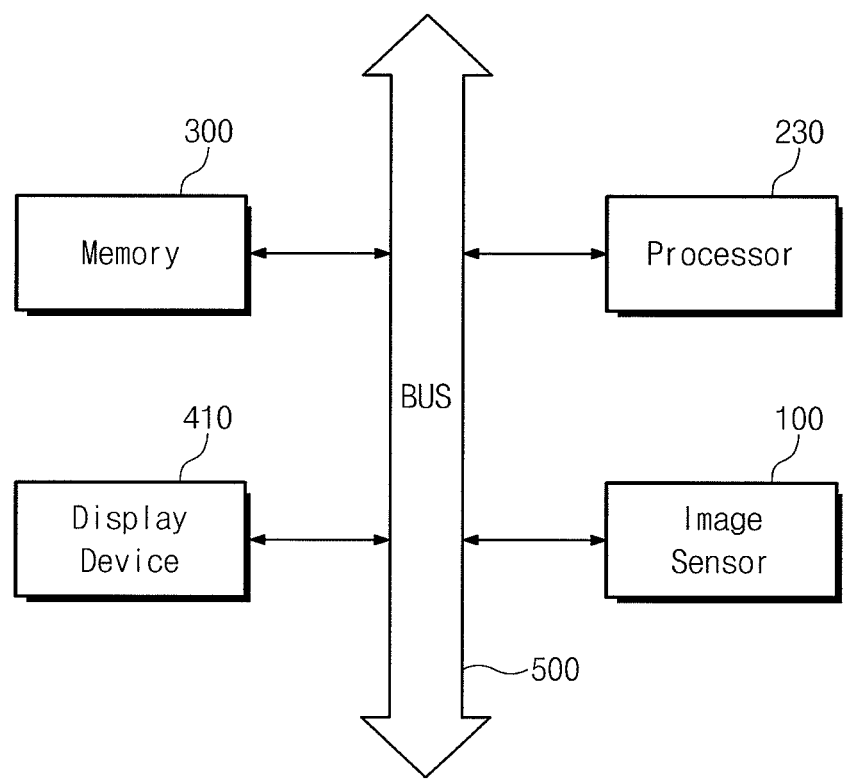
FIG. 34 illustrates a block diagram of a digital device containing an image sensor employing one or more of the features of exemplary embodiments described herein.

FIG. 34 illustrates a block diagram of a digital device include an image sensor employing one or more of the features of exemplary embodiments described herein. The digital device may be, e.g., a digital camera, a mobile device, etc.

Referring to FIG. 34, a digital camera system may include an image sensor 100, a processor 200, a memory 300, a display 400 and a bus 500. Referring to FIGS. 1 and 24, the image sensor 100 may capture optical image from outside in response to the control signal of the processor 200. The processor 200 may store the captured optical image in the memory 300 via the bus 500. The processor 200 may also output the optical image stored in the memory 300 to the display 400.

It is understood that features described above with regard to FIGS. 31-33 may be employed with various embodiments of the unit pixels including those described above with regard to FIGS. 2-30.

The foregoing is illustrative of various example embodiments and is not to be construed as limited to the specific example embodiments disclosed. Although a few exemplary embodiments have been described and specific terminologies have been used, it is readily apparent that the embodiments and terminologies are used to explain the present inventive concept and are not used to limit the meaning or the scope of the invention defined in the claims. Therefore, those who are skilled in the art will readily appreciate that various modifications are possible from the example embodiments without materially departing from the novel teachings and advantages of the present invention. Accordingly, scope of protection of the present inventive concept should be determined based upon the scope of the present inventive concept as defined in the claims.

What is claimed is:

1. An image sensor, comprising:
an active region including a photoelectric conversion region and a floating diffusion region, which are separated from each other, defined by a device isolation region on a semiconductor substrate; and
a transfer transistor including a first sub-gate provided on an upper surface of the semiconductor substrate and a second sub-gate extending within a recessed portion of the semiconductor substrate on the active region between the photoelectric conversion region and the floating diffusion region, wherein the photoelectric conversion region includes:
a plurality of photoelectric conversion elements, which vertically overlap each other within the semiconductor substrate and are spaced apart from the recessed portion,
a first photoelectric conversion element transfers charges to the floating diffusion region through a first charge flow path, and
a second photoelectric conversion element transfers charges to the floating diffusion region through a second charge flow path, the first charge flow path and the second charge flow path including different channels adjacent the second sub-gate.

2. The image sensor as claimed in claim 1, wherein the transfer transistor is arranged at a pin body of the semiconductor substrate directly adjacent to the recessed portion and includes a side channel adapted to transport charges generated in the photoelectric conversion region to the floating diffusion region.

3. The image sensor as claimed in claim 1, further including a channel impurity region surrounding the second sub-gate in the semiconductor substrate directly adjacent to the recessed portion.

4. The image sensor as claimed in claim 1, wherein the recessed portion is provided on the substrate directly adjacent to the device isolation region and extends into the device isolation region adjacent to the substrate between the photoelectric conversion region and the floating diffusion region.

5. The image sensor as claimed in claim 1, wherein a sidewall of the device isolation region and a sidewall of the recessed portion are slanted.

6. The image sensor as claimed in claim 1, wherein the device isolation region includes a device isolation impurity region.

7. The image sensor as claimed in claim 1, wherein the device isolation region includes a device isolation layer including a dielectric material and a device isolation impurity region surrounding at least a portion of the device isolation layer.

8. The image sensor as claimed in claim 1, further comprising
an interlayer dielectric layer covering the semiconductor substrate;
a planarization layer on the interlayer dielectric layer;
a color filter on the planarization layer; and
a micro lens on the color filter.

9. The image sensor as claimed in claim 1, wherein the plurality of photoelectric conversion elements receive light of different wavelengths, and are adapted to generate charges.

10. The image sensor as claimed in claim 1, wherein a pixel including the photoelectric conversion region and the floating active region has a size equal to or less than about 1 μm×1 μm, a total number of charges generated in the photoelectric conversion region is equal to or greater than about 4000 and an image lag is equal to or less than 5 e−.

11. The image sensor as claimed in claim 1, wherein:
the first photoelectric conversion element has a first pn junction, and
the second photoelectric conversion element has a second pn junction below the first pn junction.

12. The image sensor as claimed in claim 1, wherein:
the first charge flow path includes a first channel and a third channel, and
the second charge flow path includes a second channel and the third channel.

13. The image sensor as claimed in claim 2, wherein the transfer transistor includes a surface channel in the substrate adjacent to a lower surface of the first sub-gate and a buried channel in the substrate under the recessed portion.

14. The image sensor as claimed in claim 4, wherein at least one sidewall and a bottom surface of the second sub-gate contact the device isolation region.

15. The image sensor as claimed in claim 5, wherein a distance between the sidewall of the device isolation region and the sidewall of the recessed portion increases according to a depth of the semiconductor substrate.

16. The image sensor as claimed in claim 9, wherein the plurality of photoelectric conversion elements are disposed at different depths corresponding to penetration depths of the light of different wavelengths.

17. The image sensor as claimed in claim 12, wherein the first channel is between a sidewall of the second sub-gate and the third channel, and wherein the second channel is adjacent a bottom surface of the second sub-gate.

18. The image sensor as claimed in claim 13, wherein the pin body is provided between the recessed portion and the device isolation region adjacent to each other in a second direction crossing a first direction extending from the photoelectric conversion region to the floating diffusion region.

19. The image sensor as claimed in claim 13, wherein an upper surface of the pin body is lower than the upper surface of the semiconductor substrate and an upper portion of the sidewall of the recessed portion is in contact with the device isolation region directly above the side channel.

20. The image sensor as claimed in claim 16, wherein a lowermost photoelectric conversion element receives infrared wavelengths.

21. The image sensor as claimed in claim 17, wherein the second channel is closer to the second photoelectric conversion element than the first photoelectric conversion element.

22. The image sensor as claimed in claim 18, wherein the plurality of photoelectric conversion elements each include a first photoelectric conversion element directly adjacent to the upper surface of the semiconductor substrate and a second photoelectric conversion element under the first photoelectric conversion element, wherein the first photoelectric conversion element includes a first n-type impurity region and the second photoelectric conversion element includes a second n-type impurity region.

23. The image sensor as claimed in claim 18, wherein the charges generated in the second photoelectric conversion element are transported into the floating diffusion region through the side channel and the buried channel.

24. The image sensor as claimed in claim 22, wherein a distance between an edge of the first n-type impurity region and a sidewall of the recessed portion directly adjacent to the edge is equal to or greater than about 30 nm.

25. The image sensor as claimed in claim 22, wherein the second photoelectric conversion element extends below the recessed portion and a distance between an upper edge of the second photoelectric conversion element and a bottom of the recessed portion is equal to or greater than about 100 nm.

26. The image sensor as claimed in claim 22, wherein the recessed portion and the device isolation region, with a side channel therebetween, are spaced by a first distance from a depth of the center of the first n-type impurity region.

27. The image sensor as claimed in claim 22, wherein a thickness of the pin body is equal to or greater than about 30 nm from a depth of the center of the first n-type impurity region.

28. The image sensor as claimed in claim 26, wherein the first distance is equal to or greater than about 30 nm.

* * * * *